(12) United States Patent
Takakuwa et al.

(10) Patent No.: US 7,448,233 B2
(45) Date of Patent: Nov. 11, 2008

(54) METHOD FOR MANUFACTURING OPTICAL WAVEGUIDE, OPTICAL WAVEGUIDE DEVICE, ELECTRO-OPTICAL APPARATUS AND ELECTRONIC APPARATUS

(75) Inventors: Atsushi Takakuwa, Shiojiri (JP); Takayuki Kondo, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 687 days.

(21) Appl. No.: 10/863,393

(22) Filed: Jun. 9, 2004

(65) Prior Publication Data

US 2005/0016217 A1   Jan. 27, 2005

(30) Foreign Application Priority Data

Jun. 13, 2003   (JP) ............... 2003-169816

(51) Int. Cl.
  *C03B 37/022* (2006.01)
(52) U.S. Cl. .............. 65/386; 264/259; 264/229; 264/330; 264/112; 439/577; 65/395; 427/272; 427/372.2; 427/397.7
(58) Field of Classification Search ............ 65/386
  See application file for complete search history.

(56) References Cited

U.S. PATENT DOCUMENTS

| | | | | |
|---|---|---|---|---|
| 6,355,198 B1* | 3/2002 | Kim et al. | ............ | 264/259 |
| 2002/0066978 A1* | 6/2002 | Kim et al. | ............ | 264/259 |
| 2003/0234398 A1* | 12/2003 | Aoki et al. | ............ | 257/72 |
| 2004/0106324 A1* | 6/2004 | Kaneko | ............ | 439/577 |

FOREIGN PATENT DOCUMENTS

| | | |
|---|---|---|
| JP | A 03-15805 | 1/1991 |
| JP | A 5-100246 | 4/1993 |
| JP | A 06-208034 | 7/1994 |
| JP | A 2002-14250 | 1/2002 |
| JP | A 2002-202426 | 7/2002 |
| JP | A 2003-21740 | 1/2003 |
| JP | A 2003-121674 | 4/2003 |
| JP | A 2003-139975 | 5/2003 |
| JP | A 2004-061629 | 2/2004 |
| JP | A 2004-061634 | 2/2004 |
| JP | A 2004-344854 | 12/2004 |

* cited by examiner

*Primary Examiner*—Philip C Tucker
*Assistant Examiner*—Phu H Nguyen
(74) *Attorney, Agent, or Firm*—Oliff & Berridge, PLC

(57) ABSTRACT

A method for manufacturing an optical waveguide includes the steps of forming a liquid-repellent region upon a substrate, and forming the optical waveguide in a region upon the substrate other than the liquid-repellent region.

5 Claims, 18 Drawing Sheets

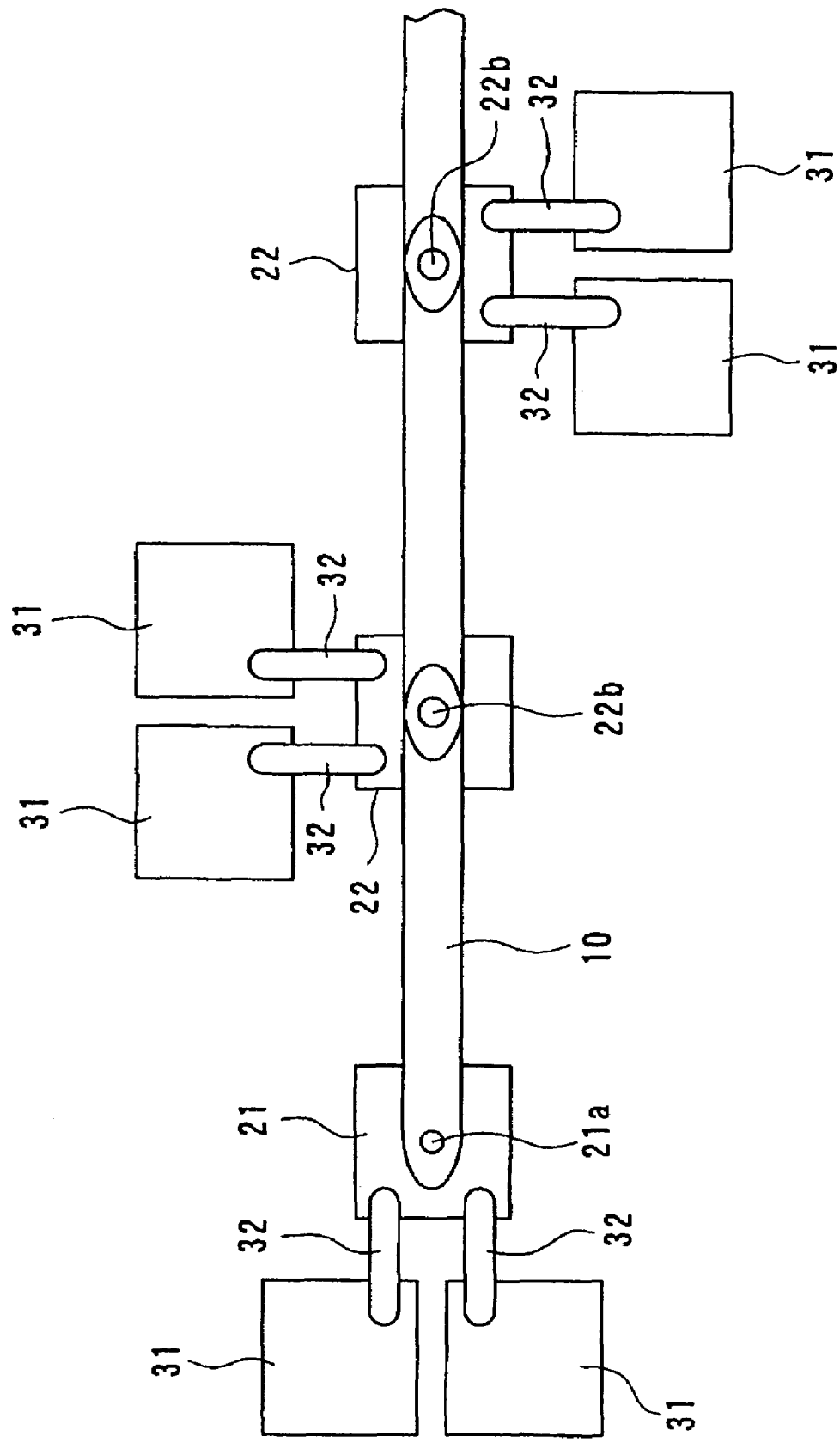

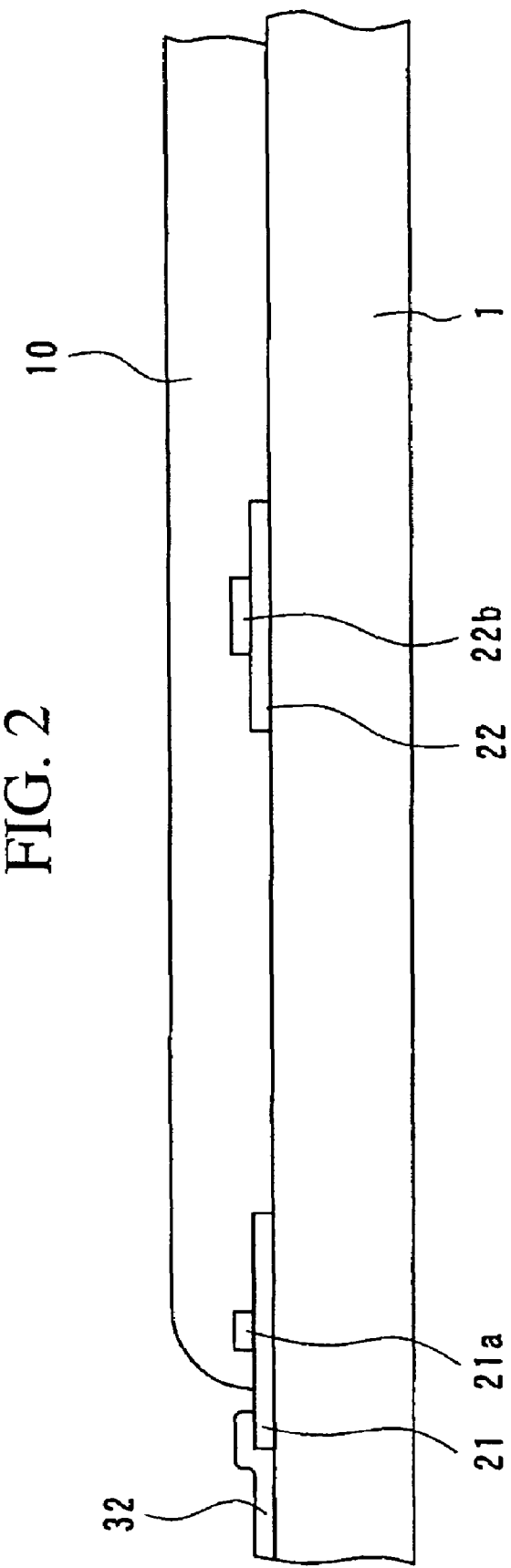

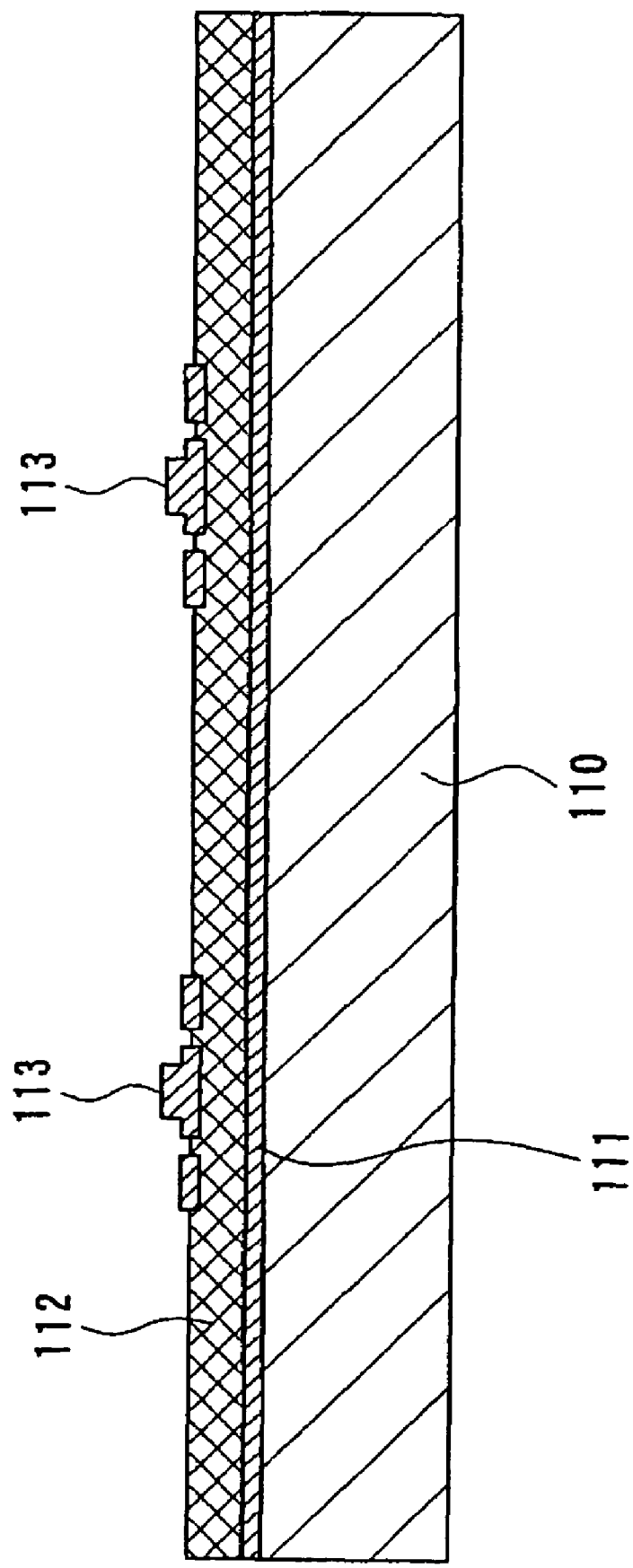

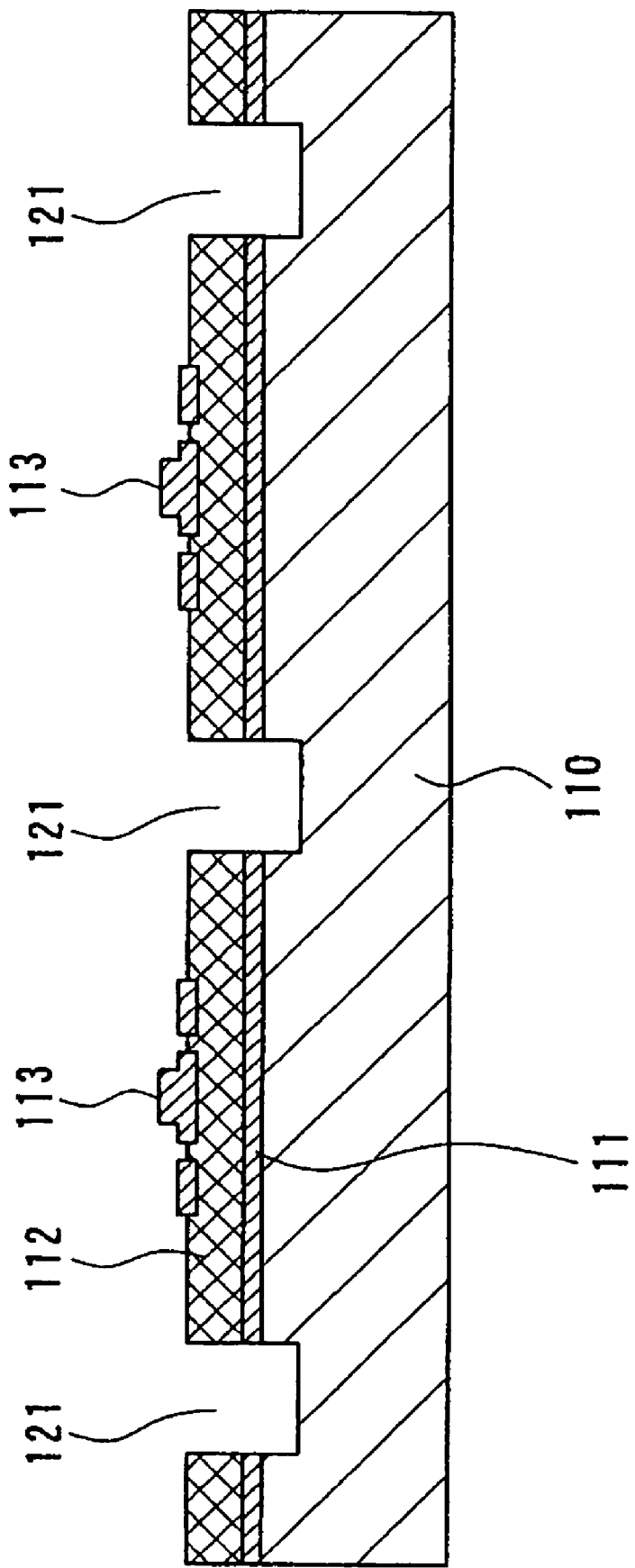

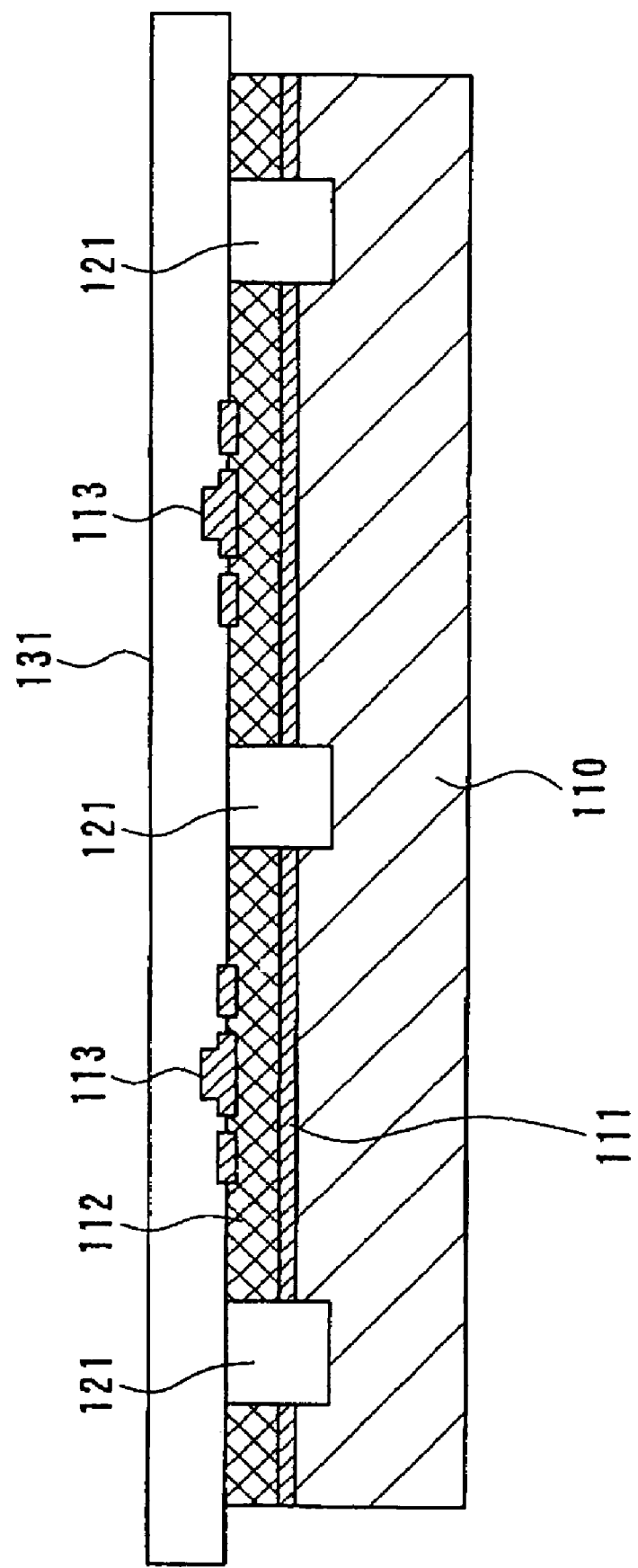

METHOD FOR MANUFACTURING OPTICAL WAVEGUIDE, OPTICAL WAVEGUIDE DEVICE, ELECTRO-OPTICAL APPARATUS AND ELECTRONIC APPARATUS

BACKGROUND OF THE INVENTION

1. Field of the Invention

The present invention relates to a method for manufacturing an optical waveguide, an optical waveguide device, an electro-optical apparatus and an electronic apparatus.

Priority is claimed on Japanese Patent Application No. 2003-169816, filed Jun. 13, 2003, the content of which is incorporated herein by reference.

2. Description of Related Art

In recent years, electroluminescent panels (ELPs), plasma display panels (PDPs), and liquid crystal display devices (LCDs) and the like have been utilized as planar display devices. In addition, as is shown, for example, in Japanese Unexamined Patent Application, First Publication No. 5-100246, techniques utilized for optical signal transmission has been investigated, in order to eliminate signal delay and the like which accompanies increase in the size and increase in the display capability of these flat display devices.

Furthermore, in recent years, due to miniaturization of the internal structure of integrated circuits, the operating speed of the CPUs of computers has progressively increased. However, a bottleneck has arisen with regard to the processing speed of computers, due to the fact that a bound has almost been reached in the signal transmission speed over the bus which connects the CPU and the peripheral devices such as storage devices. If it were to be possible to perform signal transmission over such a bus using optical signals, it would become possible remarkably to increase the limits upon the processing speed of computers.

In addition, in order to transmit data using optical signals, a light transmission device is required which transmits an optical signal which has been emitted from a light source to a predetermined location, so that it can be inputted into a light reception element or the like. In a prior art as types of such light transmission device, there is a technique which takes advantage of an optical fiber, and there is a technique which takes advantage of an optical waveguide which is formed upon a substrate.

However, if an optical fiber is taken advantage of as a light transmission device, the task of connecting together the various optical components such as a light emitting element and a light reception element and so on becomes complicated, and the problem arises that, along with the manufacture of the device becoming very costly and taking a long time, it becomes difficult to make this light transmission device compact.

In contrast, it has been considered to simplify the connection together of the light transmission medium and the various optical components such as a light emitting element and a light reception element and so on by taking advantage of an optical waveguide formed upon a substrate. However, a light transmission device which utilizes an optical waveguide has not yet been implemented, for which its miniaturization and facilitation of construction have progressed as far as making it conceivably possible to use this light transmission device in a flat display device or a computer or the like. In particular, the implementation of techniques for controlling the formation of such an optical waveguide, including its line width, easily and moreover at high accuracy have been inadequate.

The present invention has been conceived in the light of the above described circumstances, and its objective is to provide an optical waveguide, an optical waveguide device, an electro-optical apparatus, and an electronic apparatus, which can control the shape, including the line width, of an optical waveguide easily and moreover at high accuracy.

SUMMARY OF THE INVENTION

The first aspect of the present invention is a method for manufacturing an optical waveguide, having the steps of forming a liquid-repellent region upon a substrate, and forming the optical waveguide in a region upon the substrate other than the liquid-repellent region.

According to this aspect of the present invention as defined above, when manufacturing an optical waveguide upon a substrate by utilizing an optical waveguide material (a material for manufacturing the optical waveguide) which is in its liquid form, and the like, before spreading the optical waveguide material upon the substrate, a liquid-repellent region is formed upon the substrate. Here, the liquid-repellent region is a region in which the optical waveguide material cannot easily be formed, while the optical waveguide material can easily be formed in the regions other than the liquid-repellent region. Thus, according to this aspect of the present invention, by forming the liquid-repellent region so as to surround the optical waveguide formation region upon the substrate, upon which the optical waveguide is to be formed, and by thereafter loading the optical waveguide material within this optical waveguide formation region, and the like, it is possible to control the shape of the optical waveguide (its line width, the shape in which it curves, its cross sectional shape, and so on) easily and moreover at high accuracy. Furthermore, according to this aspect of the present invention, even when the optical waveguide materials have been spread upon the entire surface of the substrate, the optical waveguide material which has been spread over the liquid-repellent region experiences an action to impel it out from that region, accordingly it is possible to manufacture an extremely accurate optical waveguide in a very simple manner.

Furthermore, the second aspect of the present invention is a method for manufacturing an optical waveguide, having the steps of forming a liquid-repellent region and a liquid-affinity region upon a substrate, and forming the optical waveguide over the liquid-affinity region.

According to this aspect of the present invention as defined above, when manufacturing an optical waveguide upon a substrate by utilizing an optical waveguide material (a material for manufacturing the optical waveguide) which is in its liquid form, and the like, before spreading the optical waveguide material upon the substrate, a liquid-affinity region is formed upon the substrate. Here, the liquid-affinity region is a region in which the optical waveguide material can easily be formed, while the optical waveguide material cannot easily be formed in the regions other than the liquid-affinity region. Thus, according to this aspect of the present invention, by forming the optical waveguide formation region upon the substrate, upon which the optical waveguide is to be formed, as the liquid-affinity region, and by thereafter loading the optical waveguide material within this lyophilic optical waveguide formation region, and the like, it is possible to control the shape of the optical waveguide (its line width, the shape in which it curves, its cross sectional shape, and so on) easily and moreover at high accuracy. Furthermore, according to this aspect of the present invention, even when the optical waveguide materials has been spread upon the entire surface of the substrate, the optical waveguide material which has been spread over the regions other than the liquid-affinity region experiences an action to impel it out from those regions and to collect it in the liquid-affinity region, accordingly it is possible to manufacture an extremely accurate optical waveguide in a very simple manner.

Furthermore, the third aspect of the present invention is a method for manufacturing an optical waveguide, having the steps of forming a liquid-repellent region and a liquid-affinity region upon a substrate, and forming the optical waveguide over the liquid-affinity region.

According to this aspect of the present invention as defined above, by forming the liquid-affinity region as the region in which the optical waveguide is to be formed, and by forming the liquid-repellent region so as to surround that liquid-affinity region, accordingly it is possible to manufacture an even more accurate optical waveguide in a even simpler manner.

Furthermore, in the method for manufacturing an optical waveguide according to the present invention, it is desirable to make the optical waveguide be made by hardening an optical waveguide material in the form of liquid, and the liquid-repellent region is a region which is endowed with a characteristic of liquid repellence with respect to the optical waveguide material.

According to the present invention as defined above, for example, the liquid-repellent region is formed so as to surround the optical waveguide formation region upon the substrate, and thereafter, by spreading the optical waveguide material upon the substrate, it is possible to load this optical waveguide material is into the optical waveguide formation region simply and moreover at high accuracy. In addition, it is possible to manufacture an optical waveguide of the desired shape by hardening this optical waveguide material after it has thus been loaded into the optical waveguide formation region.

With the present invention, as the optical waveguide material, it is possible to utilize a transparent resin or sol-gel glass. By sol-gel glass is meant a solution which includes a glass component which is heated and the like, so that its substance has been converted into solid glass.

Furthermore, in the method for manufacturing an optical waveguide according to the present invention, it is desirable for the optical waveguide be made by hardening an optical waveguide material in the form of liquid, and for the liquid-affinity region is a region which is lyophilic with respect to the optical waveguide material.

According to the present invention as defined above, for example, the liquid-affinity region is formed in the optical waveguide formation region upon the substrate, and thereafter, by spreading the optical waveguide material upon the substrate, it is possible to load this optical waveguide material is into the optical waveguide formation region simply and moreover at high accuracy. In addition, it is possible to manufacture an optical waveguide of the desired shape by hardening this optical waveguide material after it has thus been loaded into the optical waveguide formation region.

Furthermore, in the method for manufacturing an optical waveguide according to the present invention, it is desirable for at least one of the liquid-repellent region and the liquid-affinity region be manufactured using a self assembled monolayer.

According to the present invention as defined above, since the liquid-repellent region or the liquid-affinity region is made using a self assembled monolayer, it is possible to control the shape of the liquid-repellent region and the liquid-affinity region with extremely high accuracy, and furthermore it is possible to control the degree of the liquid repellent characteristic and/or the lyophilic characteristic of the above region with extremely high accuracy. Here, a self assembled monolayer (SAM) is a film which is manufactured according to a self assembly (SA) method, which is a method which attaches molecules to a fixed surface, and which can thereby manufacture a highly oriented high density molecular layer.

Such a self assembly method can manipulate the molecular environment and the geometrical arrangement at the angstrom level. Furthermore, such a self assembled monolayer constitutes an effective device for a fixing technique for organic molecules, and, due to the simplicity of the method of production and the good chemical bonding which is present between the molecules and the substrate, the thermal stability of the film is also high, so that it is an important technique for manufacturing molecular elements at the angstrom level. Yet further, such a self assembled monolayer is basically a self aggregating process, and can spontaneously generate a micro pattern. Accordingly, such a self assembled monolayer can easily and simply create a pattern of a high density, such as one which is used in a ultra micro electronic circuit, in other words one for which a current lithographic method cannot be utilized. Thus, according to the present invention, it is possible to manufacture an extremely thin optical waveguide simply and moreover at high accuracy.

Furthermore, in the method for manufacturing an optical waveguide according to the present invention, it is desirable for at least one of the liquid-repellent region and the liquid-affinity region be made by forming a mask layer in a desired pattern upon the substrate, forming a self assembled monolayer upon the substrate, and removing the mask layer.

According to the present invention as defined above, it is possible to manufacture an optical waveguide simply and moreover at high accuracy by using a conventional exposure device or the like which is utilized in the production of semiconductor elements.

Furthermore, in the method for manufacturing an optical waveguide according to the present invention, it is desirable for the mask layer be made by utilizing a photolithographic method.

According to the present invention as defined above, it is possible to manufacture an optical waveguide simply and moreover at high accuracy by using a conventional semiconductor production device.

Furthermore, in the method for manufacturing an optical waveguide according to the present invention, it is desirable for the mask layer to be made from a resist material.

According to the present invention as defined above, the resist is formed upon the substrate, and thereafter it is possible to form a mask layer of the desired shape easily by patterning the resist with an exposure device or the like.

Furthermore, in the method for manufacturing an optical waveguide according to the present invention, it is desirable for the mask layer to be made by utilizing a droplet discharge method.

According to the present invention as defined above, by discharging the liquid material from an ink jet nozzle or the like in a predetermined location upon the substrate, it is possible to form the mask layer easily and also economically.

Furthermore, in the method for manufacturing an optical waveguide according to the present invention, it is desirable for at least one of the liquid-repellent region and the liquid-affinity region be made by forming a self assembled monolayer upon the substrate, and removing (i.e., patterning) a desired portion of the self assembled monolayer by utilizing at least one of an electron beam, an ion beam, and a light beam.

According to the present invention as defined above, it is possible to manufacture a liquid-repellent region or a liquid-affinity region which is made from a self assembled monolayer of the desired shape without making any mask layer consisting of the resist pattern or the like, in other words without utilizing any photolithography or the like. In addition, since the electron beam, ion beam, or light beam can be made into an extremely minute spot which can be position controlled very easily and moreover at high accuracy, accordingly it is possible to control the shape of the resulting optical waveguide, such as its line width and the like, easily and moreover at high accuracy.

Accordingly, it is possible to manufacture an extremely fine optical waveguide very easily by applying the present invention.

Furthermore, in the method for manufacturing an optical waveguide according to the present invention, it is desirable for at least one of the liquid-repellent region and the liquid-affinity region be made by forming a self assembled monolayer upon the substrate, and converting the substance of a desired surface portion of the self assembled monolayer by utilizing at least one of an electron beam, an ion beam, and a light beam.

According to the present invention as defined above, it is possible to control the surface energy of the self assembled monolayer with the electron beam, the ion beam, or the light beam. Accordingly, it is possible to control the levels (intensities of the lyophilic characteristic and of the liquid repellent characteristic of the self assembled monolayer easily and moreover at high accuracy.

Furthermore, in the method for manufacturing an optical waveguide according to the present invention, it is desirable for the conversion of the substance of a desired surface portion of the self assembled monolayer consists of one of increasing a liquid repellence, and increasing a lyophilicity of the surface portion.

Furthermore, in the method for manufacturing an optical waveguide according to the present invention, it is desirable for the wavelength of the light beam to be below 250 nm.

According to the present invention as defined above, by making the wavelength of the light to be less than 250 nm so that it has high energy, it is possible to remove the desired portions of this self assembled monolayer, irrespective of the type of the self assembled monolayer.

Furthermore, in the method for manufacturing an optical waveguide according to the present invention, it is desirable for at least one of the liquid-repellent region and the liquid-affinity region be made by making a predetermined stamp (i.e., a form), manufacturing a self assembled monolayer upon the stamp, and transferring the self assembled monolayer from the stamp to the substrate.

According to the present invention as defined above, since the stamp (the form) is made by using a material such as silicone rubber or the like, and the self assembled monolayer is transferred to the substrate using this stamp, accordingly it is possible to manufacture a plurality of such self assembled monolayers of the same pattern by using, for example, a single stamp in a repeated manner.

Furthermore, in the method for manufacturing an optical waveguide according to the present invention, it is desirable for the transfer of the self assembled monolayer from the stamp to the substrate to be performed by micro contact printing.

According to the present invention as defined above, it is possible to make a self assembled monolayer of a desired pattern upon the substrate by micro contact printing (µCP), which is one type of offset printing.

Furthermore, in the method for manufacturing an optical waveguide according to the present invention, it is desirable for the qualities of the materials of the stamp, the self assembled monolayer, and the substrate are selectively set so that the affinity between the surface of the stamp and the self assembled monolayer is weaker than the affinity between a portion upon the substrate where at least one of the liquid-repellent region and the liquid-affinity region is formed, and the self assembled monolayer.

According to the present invention as defined above, by pressing the self assembled monolayer which has been made upon the stamp against the substrate and sticking it there, it is possible to transfer this self assembled monolayer to the desired region upon the substrate in a simple and moreover satisfactory manner.

Furthermore, in the method for manufacturing an optical waveguide according to the present invention, it is desirable for the temperatures of the stamp, the self assembled monolayer, and the substrate, at least at one desired location thereof, are controlled so that the affinity between the surface of the stamp and the self assembled monolayer is weaker than the affinity between a portion upon the substrate where at least one of the liquid-repellent region and the liquid-affinity region is formed, and the self assembled monolayer.

According to the present invention as defined above, by, along with controlling the temperature of the self assembled monolayer or of the desired location upon the substrate, also pressing the self assembled monolayer which has been made upon the stamp against the substrate and sticking it there, it is possible to transfer this self assembled monolayer to the desired region upon the substrate in a simple and moreover satisfactory manner.

Furthermore, in the method for manufacturing an optical waveguide according to the present invention, it is desirable for the transfer of the self assembled monolayer to the substrate be performed by pressing the stamp against the surface of the substrate, adhering the self assembled monolayer to the substrate, and ablating and stripping off the self assembled monolayer from the stamp.

According to the present invention as defined above, when the self assembled monolayer which has been made upon the stamp is transferred to the substrate, by irradiating the self assembled monolayer upon the stamp with a laser or the like and ablating it, it is possible to strip off the self assembled monolayer from the stamp at high accuracy.

Furthermore, in the method for manufacturing an optical waveguide according to the present invention, it is desirable, in the case that both a liquid-repellent region and a liquid-affinity region are formed upon the substrate, for the liquid-affinity region be formed after the formation of the liquid-repellent region.

According to the present invention as defined above, by first forming the liquid-repellent region, and thereafter forming the liquid-affinity region, it is possible to form the liquid-repellent region and the liquid-affinity region in the desired pattern more simply and at higher accuracy. This is because, if the liquid-affinity region were to be formed first, and thereafter the liquid-repellent region were to be formed, it would be easy for the material or the like for making the liquid-repellent region to insinuate itself into the liquid-affinity region.

Furthermore, in the method for manufacturing an optical waveguide according to the present invention, it is desirable for the self assembled monolayer to be made using at least one of an organic type silicon compound and a thiol compound.

According to the present invention as defined above, it is possible to manufacture the self assembled monolayer which is to define the liquid-repellent region or the liquid-affinity region by utilizing an organic type silicon compound (a silane coupling material) and/or a thiol compound. A thiol compound is, generically, an organic compound ($R^1$—SH) which has a mercapto-base (—SH). In addition, a silane coupling material is a compound which is expressed by $R^2{}_n SiX_{4-n}$. In particular, a compound which has a fluorine atom, such as one where $R^1$ or $R^2$ is $C_n F_{2n+1} C_m H_{2m}$, is suitable as a material for a self assembled monolayer which is to be used for making the liquid-repellent region, since its affinity for other materials is low and its liquid repellence characteristic is high. Furthermore, a mercapto-base or a compound which includes —COOH is suitable as a material for a self assembled monolayer which is used for making the liquid-affinity region, since its affinity for other materials is high.

Furthermore, the fourth aspect of the present invention is a method for manufacturing an optical waveguide, having the steps of forming at least one of a liquid-repellent region and a liquid-affinity region upon a substrate, hardening an optical waveguide material from liquid form upon a desired portion of the substrate, and subjecting the substrate to a heat reflow process.

According to the present invention as defined above, by subjecting the optical waveguide material which has hardened to a heat reflow process, it is possible to make the angular shape of this optical waveguide material into a smooth curved shape (a lens shape). Here, such an angular shaped portion of the optical waveguide would have been a location at which loss of propagated light would occur. Thus, with the present invention, it is possible to form an optical waveguide which has high optical coupling efficiency in a simple manner.

Furthermore, in this method for manufacturing an optical waveguide according to the present invention, it is desirable for the heat reflow process be a process of controlling the cross sectional shape of the optical waveguide.

According to the present invention as defined above, by subjecting the optical waveguide material which has hardened to a heat reflow process, it is possible to form the cross sectional shape of the optical waveguide into, for example, a convex lens shape or a semicircular shape or the like, so that it is possible to form an optical waveguide which has high optical coupling efficiency in a simple manner.

Furthermore, in this method for manufacturing an optical waveguide according to the present invention, further having the steps of converting a predetermined material into the form of a mist, and layering the predetermined material upon the substrate.

According to the present invention as defined above, it is possible to form, upon a substrate on which a liquid-repellent region or a liquid-affinity region has been formed, a predetermined material for making an optical waveguide (an optical waveguide material, in other words a polyimide or the like) upon a predetermined region of the substrate by converting this optical waveguide material into a mist by the use of ultrasonic waves or the like. Here, since the optical waveguide material which is converted into a mist experiences an action to expel it from the liquid-repellent region and/or to collect it in the liquid-affinity region, thereby, according to the present invention, it is possible to control the shape of the optical waveguide, such as its line width and so on, easily and moreover at high accuracy.

In addition, the fifth aspect of the present invention is an optical waveguide device having an optical waveguide which has been manufactured by a method for manufacturing an optical waveguide according to any one of the methods described above.

According to the present invention as defined above, it is possible simply to provide an optical waveguide device which has, as one of its main structural elements, an optical waveguide whose shape, such as its line width and so on, is controlled at high accuracy. Thus, according to the present invention, it is possible simply to provide a extremely minute and high density device which operates at high speed using optical signals.

Furthermore, in the optical waveguide device according to the present invention, it is desirable for the optical waveguide device to includes a optical waveguide and a micro tile shaped element which comprises a light emitting element or a light reception element which is optically connected to the optical waveguide.

According to the present invention as defined above, it is possible simply to provide an optical waveguide device which has, as two of its main structural elements, a micro tile shaped element of an extremely minute form (for example, having an area less than or equal to some hundreds of $\mu m^2$ and having a thickness less than or equal to some tens of $\mu m$), and the above described optical waveguide. Thus, according to the present invention, it is possible simply to provide a extremely minute and high density device which operates at high speed using optical and electrical signals.

In addition, the sixth aspect of the present invention is an electro-optical apparatus having an optical waveguide device according to the types described proximately above.

According to the present invention as defined above, by, for example, transmitting a scanning signal of a flat display or the like via the above described optical waveguide device, it is possible to transmit the scan signal at high speed, and moreover it is possible to implement increase of the size, increase of the quality, and enhanced thinness for such a screen of a flat display device.

In addition, the seventh aspect of the present invention is an electronic apparatus comprising an optical waveguide device according to the type described proximately above.

According to the present invention as defined above, by, for example, applying the above described optical waveguide device to an integrated circuit, it is possible to provide, at a cheap price, an extremely compact electronic device which is capable of high speed processing of signals.

Furthermore, according to the present invention as defined above, by, for example, applying the above described optical waveguide device to a display device, it is possible to provide a cheap electronic device which can display an image of high quality at high speed.

BRIEF DESCRIPTION OF THE DRAWINGS

FIG. 1 is a plan view of an optical waveguide device according to a preferred embodiment of the present invention.

FIG. 2 is a partial sectional view of this optical waveguide device.

FIG. 10 is a schematic sectional view showing a first process in the method for manufacturing a micro tile shaped element.

FIG. 11 is a schematic sectional view showing a second process in this method of manufacture.

FIG. 12 is a schematic sectional view showing a third process in this method of manufacture.

DETAILED DESCRIPTION OF THE INVENTION

Figure 3A:
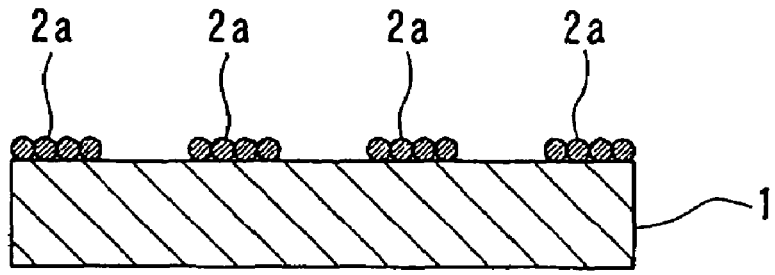
FIGS. 3A and 3B are general sectional views showing a first method for manufacturing the optical waveguide device according to this preferred embodiment of the present invention.

In the following, preferred embodiments of the method for manufacturing an optical waveguide according to the present invention, and of the optical waveguide device according to the present invention, will be explained with reference to the drawings.

(Structural Example)

First, an example of the structure of an optical waveguide device according to a preferred embodiment of the present invention will be explained with reference to FIGS. 1 and 2. FIG. 1 is a plan view showing such an optical waveguide device according to a preferred embodiment of the present invention. In addition, FIG. 2 is a partial sectional view of the optical waveguide device shown in FIG. 1.

This optical waveguide device includes an optical waveguide 10 formed upon the surface of a substrate 1 or the like, micro tile shaped elements 21 and 22 which are adhered to the surface of the substrate 1 or the like, and bonding pads 31 which are formed upon the surface of the substrate 1 or the like and which constitute electrodes, and metallic lead wires 32. The bonding pads 31 are electrodes (terminals) of electronic circuits such as integrated circuits or the like (not shown in the figures) which are formed upon the substrate 1. The metallic lead wires connect the bonding pads 31 and the micro tile shaped elements 21 and 22 together electrically. Due to this, each of these micro tile shaped elements 21 and 22 is electrically connected via the bonding pads 31 and the metallic lead wires 32 to the integrated circuit or the like upon the substrate 1.

The micro tile shaped elements 21 and 22 are semiconductor devices which are formed in the shape of minute tiles. In FIG. 1, a single such micro tile shaped element 21 and two such micro tile shaped elements 22 are shown, by way of example, as being provided to this optical waveguide device; but others thereof may be provided, for example off the drawing paper, to the right of the FIG. 1 construction.

Each of these micro tile shaped elements 21 and 22, for example, is a plate shaped member which has a thickness of 20 μm or less, and its length and width may be from tens of μm to hundreds of μm. The method of manufacture of these tile shaped elements 21 and 22 will be explained in detail hereinafter. In addition, the micro tile shaped element 21 includes a light emission section 21a which is endowed with a function of emitting light. Moreover, each of the micro tile shaped elements 22 includes a light reception section 22b which is endowed with a function of receiving light.

The optical waveguide 10 is a device for optically connecting together the micro tile shaped element 21 and the micro tile shaped elements 22. In addition, the optical waveguide member which is constituted, in this preferred embodiment, by the optical waveguide 10 is formed so as to be overlapped by the light emission section 21a of the micro tile shaped element 21 and by the light reception sections 22b of the micro tile shaped element 22. It should be understood that the light emission section 21a and the light reception sections 22b, and the optical waveguide 10, need not necessarily be closely contacted together in this manner; it would also be acceptable, alternatively, to leave gaps between them.

According to this structure, an electrical signal which is outputted from an integrated circuit or the like upon the substrate 1 is converted into an optical signal by the micro tile shaped element 21. This optical signal is propagated along the optical waveguide 10, is received by the micro tile shaped elements 22, and is converted by each of them into an electrical signal. These electrical signals are fed as input signals to other integrated circuits or the like upon the substrate 1. Accordingly it is possible, with the above described structure, for example, to perform mutually transmission of signals between a plurality of integrated circuits which are formed upon the substrate 1 at extremely high speed.

Furthermore, the optical signal which has been emitted from a single micro tile shaped element 21 as shown in FIG. 1 is propagated along the optical waveguide 10 and is incident into the plurality of micro tile shaped elements 22 almost simultaneously.

Moreover, according to the above described structure, it is possible to transmit individual optical signals to each of a plurality of reception locations in parallel, using a single optical waveguide 10.

The light emission section 21a of the micro tile shaped element 21 may be made from, for example, an LED, a VCSEL (Vertical Cavity Surface Emitting Laser), or a DFB (Distributed Feedback) laser which includes an internal electric field absorption modulator. Although it is easy to manufacture this light emission device using a LED which has the simplest internal structure, the modulation speed of the optical signal of such a light emission device is around some hundreds of Mbps, which is rather slow. By contrast to this, with a VCSEL, it is possible to obtain modulation at the extremely high speed of more than 10 Gbps, and it is possible to drive it with a low consumption of electrical power, since its threshold value electrical current is small and its light emission efficiency is high. On the other hand, with a DFB laser, while its modulation speed of about 1 Gbps falls rather short of that of a surface emission optical laser, however, it is possible to propagate an optical signal at better efficiency than with a surface emission optical laser, since it emits the laser light beam from the end portion of the micro tile shape in a direction which is parallel to the plane of the substrate 1, in other words in the direction along the optical waveguide 10.

The light reception section 22b of the micro tile shaped element 22 may be made from, for example, a photodiode or a phototransistor. Here, as such a photodiode, it is possible to choose, according to the application, a PIN type photodiode, an APD (an avalanche photodiode), or an MSM type photodiode. With an APD, the optical sensitivity and the response frequency are both high. As for an MSM type photodiode, it can be easily integrated with an transistor for amplification using a simple internal structure.

Furthermore, it would also be acceptable to form another third micro tile shaped element (not shown in the figures) having a light reception device so as to overlap the micro tile shaped element 21. If this is done, the light amount which is emitted by the micro tile shaped element 21 can be monitored by this third micro tile shaped element 21, and, by feeding its value back to the micro tile shaped element 21, it becomes possible to endow the device with an APC function, so that it is possible to implement optical data transmission in a stabilized manner. Alternatively, it would also be possible to provide such an APC function to the micro tile shaped element 21 itself. Furthermore, it is desirable for the micro tile shaped element 22 to comprise a circuit or the like for amplifying the signal which it has detected. By doing this, it is possible further to enhance the performance of the device.

In addition, the micro tile shaped element 21 and the micro tile shaped element 22 may be electrically connected to electronic circuitry (not particularly shown in the figures), such as an integrated circuit which is provided upon the substrate 1, or an EL (electro-luminescent display circuit, a plasma display, a liquid crystal display circuit, or the like. By doing this, it is possible to increase the speed of a computer system which is made up from integrated circuits and the like over the prior art, while keeping it compact. Furthermore, it is possible to transmit a scan signal for a flat display or the like which is provided upon the substrate 1 at high speed using an optical waveguide device of this preferred embodiment of the present invention, so that it is possible to spur on increase in the size and increase in the product quality of the screen of such a flat display device.

Furthermore, it would be acceptable for a plurality of both the micro tile shaped element 21 and also the micro tile shaped element 22 to be connected to a single optical waveguide 10. In this case, it would be acceptable for each of these micro tile shaped elements 21 to be made to emit light upon a different wavelength. Moreover, it would be desirable for each of the micro tile shaped elements 22 to include a light reception device which was endowed with a wavelength selection function for light which was emitted by at least one of the micro tile shaped elements 21. By doing this, it would be possible for the plurality of optical signals which were individually transmitted from each of the plurality of micro tile shaped elements 21 to be simultaneously propagated along the same single optical waveguide 10, and to be individually detected by the plurality of micro tile elements 22. Accordingly, it would be possible easily to manufacture a bus which was able to transmit and receive a plurality of optical signals in parallel along a single optical waveguide 10.

Furthermore, although in FIG. 1 the optical waveguide 10 was shown as being made in the form of a straight line, it would also alternatively be possible for it to be formed as a curved shape, and/or to be provided with a plurality of branches. Yet further, it might be formed in a loop shape. Moreover, it would be acceptable for it to be formed in the shape of a sheet, so as to cover a plurality of tile shaped elements. Of course, it is possible to provide a plurality of assemblies of micro tile shaped elements 21, micro tile shaped elements 22, and optical waveguides 10 upon the surface of the same single substrate 1. Finally, it is also possible to form first micro tile shaped elements 21 and second micro tile shaped elements 22 and optical waveguides 10 upon both the front surface and the rear surface of the substrate 1.

(Methods for Manufacturing an Optical Waveguide)

Next, several methods for manufacturing the optical waveguide according to the preferred embodiment of the present invention will be explained with reference to FIGS. 3A to 9B.

(First Manufacturing Method)

Figure 3B:
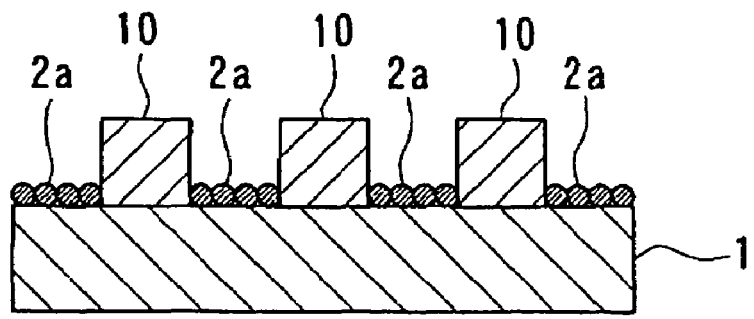

FIGS. 3A and 3B are general sectional views showing a first method of manufacture of the optical waveguide according to the preferred embodiment of the present invention. To structural elements which are the same as in the optical waveguide device described above, the same reference symbols are appended.

First, as shown in FIG. 3A, upon the surface of the substrate 1, there is formed a liquid-repellent region (a liquid repellent pattern) which is made from a self assembled monolayer which has the characteristic of being liquid repellent. As the substrate 1, any suitable one of glass, glass epoxy, silicon, plastic, ceramic, film, polyimide or the like may be employed.

As a method of manufacture of such a self assembled monolayer, for example, the following may be performed. First, a layer of gold or the like is formed upon the surface of the substrate 1 by vapor deposition or the like. After this, the substrate 1 is washed. Thereafter, it is soaked for a predetermined time period in an ethanol solution of thiol of a concentration from several μmol/liter to several tens of μmol/liter, and thereby a self assembled monolayer is formed. After this, the surface of the gold layer is washed in ethanol and pure water in that order. According to requirements, the surface of the gold layer is dried in a nitrogen atmosphere. The self assembled monolayer is made in the above described manner. This method of manufacture of a self assembled monolayer can be utilized in any and all of the various methods which will be described hereinafter.

Furthermore, it is desirable for this liquid-repellent region to be a region upon the substrate 1 which surrounds the region for formation of the optical waveguide 10. In addition, in this preferred embodiment of the present invention, it is desirable for the formation of the liquid-repellent region to be performed after having adhered the micro tile shaped elements 21 and 22 in their predetermined places upon the substrate 1, whereby the optical waveguide 10 may be formed so as to cross across the micro tile shaped elements 21 and 22. Accordingly, it is desirable for the liquid-repellent region to be formed, not only upon the surface of the substrate 1, but also upon certain portions of the surfaces of the micro tile shaped elements 21 and 22.

In addition, the liquid-repellent region of the desired pattern is formed by forming, as a pattern, the self assembled monolayer 2a which has a liquid repellent characteristic upon the entire portion which is to constitute the above described liquid-repellent region on the surface of the substrate 1. The self assembled monolayer 2a is one which has a liquid repellent characteristic with respect to the optical waveguide 10 (the optical waveguide material in liquid form). For example, this self assembled monolayer 2a which has a liquid repellent characteristic may be made using a silane coupling material (an organic type nitrogenous compound) or a thiolized compound.

Here, by a thiol compound, is meant a generic organic compound ($R^1$—SH) having a mercapto-base (—SH). A silane coupling material is a compound given by $R^2_n SiX_{4-n}$. In particular, a compound including fluorine atoms such as one in which $R^1$ or $R^2$ is $C_n F_{2n+1} C_m H_{2m}$ is suitable as a material for forming the liquid-repellent region, since its affinity for other materials is low and its liquid repellence characteristic is high.

Next, as shown in FIG. 3B, the optical waveguide 10 is made upon a portion of the surface of the substrate 1 other than the liquid-repellent region which is made from the self assembled monolayer 2a. An example of making such an optical waveguide 10 will now be described in concrete terms. First, the material for making the optical waveguide (the optical waveguide material) which is in liquid form is spread upon the surface of the substrate 1 in the state shown in FIG. 3A. As such a material for the optical waveguide, it is possible to employ a transparent resin such as polyimide or the like, or sol-gel glass.

When this has been done, the optical waveguide material which has been spread upon the substrate 1 is the subject of an action (experiences a force) which expels it from above the self assembled monolayer 2a, and it collects in the portions other than this liquid-repellent region, and it is the subject of an action (experiences a force) which prevents if from coming off from these portions other than the liquid-repellent regions. Accordingly, even though the optical waveguide material is spread over the entire surface of the substrate 1, and even though the optical waveguide material is spread over the liquid-repellent region, this optical waveguide material comes reliably and accurately to fill up the entire region other than the liquid-repellent regions (i.e. the region where the optical waveguide is to be formed), and only that region. After this, the optical waveguide material is hardened, so as to form the optical waveguide 10.

By performing these processes, according to this preferred embodiment of the present invention, it is possible to make a high accuracy optical waveguide in an extremely simple fashion.

(Second Manufacturing Method)

Figure 4A:
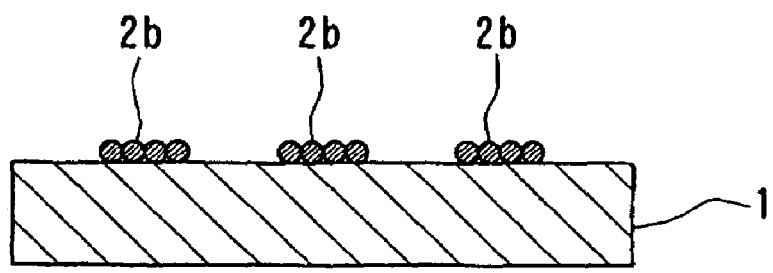
FIGS. 4A and 4B are general sectional views showing a second method for manufacturing the optical waveguide device according to this preferred embodiment of the present invention.
Figure 4B:
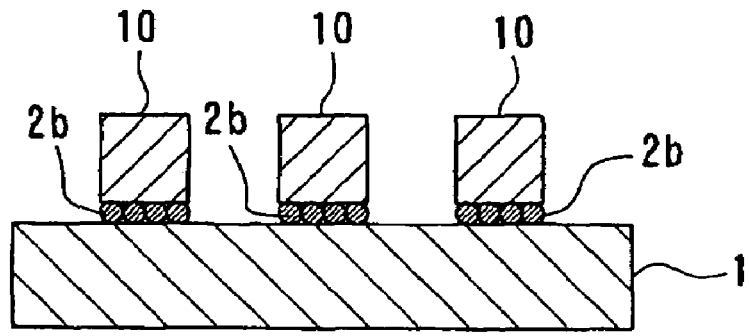

FIGS. 4A and 4B are general sectional views showing a second method of manufacture of the optical waveguide according to the preferred embodiment of the present invention. First, as shown in FIG. 4A, a liquid-affinity region (a lyophilic pattern) which is made up from a self assembled monolayer 2b which has the quality of being lyophilic is formed upon the surface of the substrate 1. It is desirable for this liquid-affinity region to be the same region upon the substrate 1 as the region where the optical waveguide 10 is to be formed. In addition, in this preferred embodiment of the present invention, since an optical waveguide 10 is to be formed so as to cross over the micro tile shaped elements 21 and 22, it is desirable for the formation of this liquid-affinity region to be performed after the micro tile shaped elements 21 and 22 have been adhered in predetermined positions upon the substrate 1. Accordingly it is desirable, not only for the liquid-affinity region to be formed upon the upper surface of the substrate 1, but also for it to be formed upon portions of the upper surfaces of the micro tile shaped elements 21 and 22.

This self assembled monolayer 2b which is endowed with the characteristic of lyophilicity may be formed using a silane coupling material (an organic type oxygen compound) or a thiol compound. A thiol compound is an organic compound ($R^1$—SH) which has a mercapto-base (—SH). In addition, a compound which has a mercapto-base or —COOH is suitable as a material for the self assembled monolayer 2b from which the liquid-affinity region is to be formed, because it has a high affinity for other materials.

Next, as shown in FIG. 4B, the optical waveguide 10 is formed in the liquid-affinity region upon the surface of the substrate 1 which is made from the self assembled monolayer 2b. First, the material for formation of the optical waveguide (the optical waveguide material), in liquid form, is spread upon the surface of the substrate 1 in the situation shown in FIG. 4A. For this optical waveguide material, the same optical waveguide material as was employed in the first method of manufacture described above and shown in FIGS. 3A and 3B may be utilized.

When this has been done, the optical waveguide material which has been spread upon the surface of the substrate 1 is pulled towards the self assembled monolayer 2b, while it experiences an action which causes it to be forced away from the portions other than those where the self assembled monolayer 2b is present. Accordingly, even though the optical waveguide material is spread over the entire surface of the substrate 1, and even though the optical waveguide material is spread over the regions other than the liquid-affinity region, this optical waveguide material comes reliably and accurately to fill up the entire extent of the liquid-affinity region (i.e. the portions where the optical waveguide is to be formed). After this, the optical waveguide material is hardened, so as to form the optical waveguide 10.

In this manner, according to this preferred embodiment of the present invention, it is possible to make an optical waveguide of high accuracy in an extremely simple manner.

(Third Manufacturing Method)

Figure 5A:
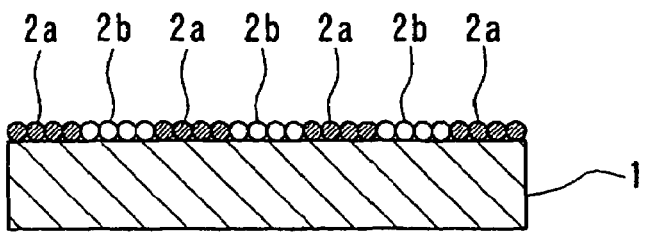
FIGS. 5A and 5B are general sectional views showing a third method for manufacturing the optical waveguide device according to this preferred embodiment of the present invention.
Figure 5B:
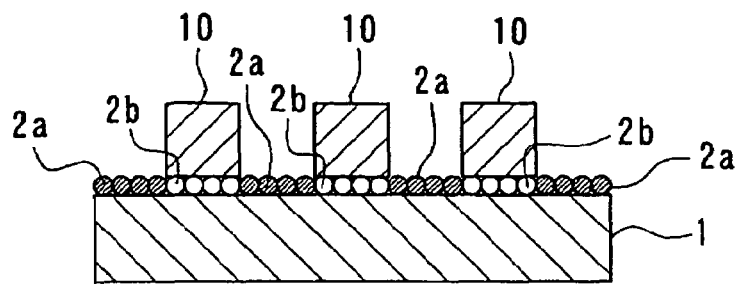

FIGS. 5A and 5B are general sectional views showing a third method of manufacture of the optical waveguide according to the preferred embodiment of the present invention. First, as shown in FIG. 5A, upon the surface of the substrate 1, there are formed a liquid-repellent region which is made of a self assembled monolayer 2a which is endowed with a liquid repellent characteristic, and a liquid-affinity regions which is made of a self assembled monolayer 2b which is endowed with a lyophilic characteristic.

Here, for example, the liquid-affinity region is taken as being the same region upon the substrate 1 as the region in which the optical waveguide is to be formed, while the liquid-repellent region is taken as being a region which surrounds the region in which the optical waveguide is to be formed. In addition, in this preferred embodiment of the present invention, it is desirable for the formation of the liquid-repellent region and of the liquid-affinity region to be performed after having adhered the micro tile shaped elements 21 and 22 in their predetermined places upon the substrate 1, whereby the optical waveguide 10 may be formed so as to cross across the micro tile shaped elements 21 and 22. Accordingly, it is desirable for the liquid-repellent region and the liquid-affinity region to be formed, not only upon the surface of the substrate 1, but also upon certain portions of the surfaces of the micro tile shaped elements 21 and 22.

Furthermore, it is desirable for the formation of the liquid-repellent region upon the substrate 1 to be performed before the formation of the liquid-affinity region. For example, if the liquid-affinity region is made first, and afterwards the liquid-repellent region is formed, then when forming the liquid-repellent region, the material or the like for formation of the liquid-repellent region may easily insinuate into the liquid-affinity region, so that it becomes difficult to form a detailed and precise liquid repellent—lyophilic pattern. On the other hand, if the liquid-repellent region is formed first, then, since it is difficult for the material or the like for formation of the liquid-affinity region to insinuate itself into the liquid-repellent region, accordingly it is possible to make the desired pattern for the liquid-repellent region and the liquid-affinity region simply and moreover at high accuracy.

Next, as shown in FIG. 5B, the optical waveguide 10 is made upon the surface of the substrate 1 in the liquid-affinity region where the self assembled monolayer 2b is present. An example of making such an optical waveguide 10 will now be described in concrete terms. First, the material for making the optical waveguide (the optical waveguide material) which is in liquid form is spread upon the surface of the substrate 1 in the state shown in FIG. 5A. As such a material for the optical waveguide, it is possible to employ the same optical waveguide material as was utilized in the first method of manufacture shown in FIGS. 3A and 3B and described above.

When this has been done, the optical waveguide material which has been spread upon the substrate 1 is the subject of an action which expels it from above the self assembled monolayer 2a, while pulling it towards the self assembled monolayer 2b. Accordingly, even though the optical waveguide material is spread over the entire surface of the substrate 1, and even though the optical waveguide material is spread over the liquid-repellent region (the self organizing molecular film 2a), this optical waveguide material comes reliably and accurately to fill up the entire liquid-affinity region (i.e., the region where the optical waveguide is to be formed). After this, the optical waveguide material is hardened, so as to form the optical waveguide 10.

In this manner, according to this preferred embodiment of the present invention, it is possible to make an optical waveguide of high accuracy in an extremely simple manner.

(Method for Manufacturing a Self Assembled Monolayer)

Next, a method of manufacture of the self assembled monolayer which constitutes the above described liquid-repellent region and/or liquid-affinity region which is utilized in the above described method for manufacturing an optical waveguide according to the present invention will be explained with reference to FIG. 6A to FIG. 8D.

(First Method for Manufacturing a Self Assembled Monolayer)

Figure 6A:
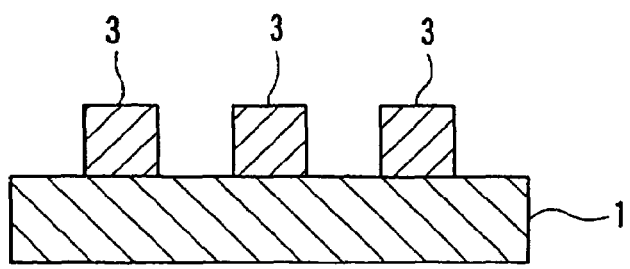
FIGS. 6A to 6C are general sectional views showing a first SAMs method for manufacturing the optical waveguide device according to this preferred embodiment of the present invention.
Figure 6B:
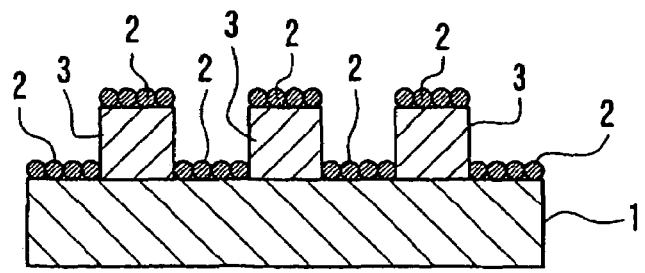
Figure 6C:
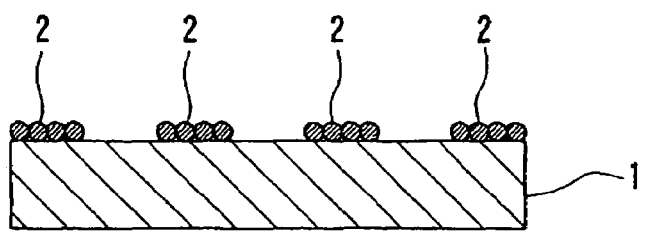

FIGS. 6A to 6C are general sectional views showing a first method of manufacture of a self assembled monolayer according to a preferred embodiment of the present invention. First, as shown in FIG. 6A, a pattern of a resist 3, which constitutes a mask material, is formed upon the surface of the substrate 1. The pattern of this resist 3 is formed by a lithographic method in which the resist is patterned by an exposure device or the like, or by a liquid drop discharge method or the like, in which liquid material is discharged from an ink jet nozzle or the like in desired locations upon the substrate. Furthermore, the pattern of the resist 3 is a pattern which corresponds to the above described liquid-repellent region or to the above described liquid-affinity region, in other words, is a pattern which corresponds to the region in which the optical waveguide 10 is to be formed, or to the region other than the region in which it is to be formed.

After this, as shown in FIG. 6B, the self assembled monolayer 2 is made as a layer over the entire surface of the substrate 1 where the resist 3 has been formed. This self assembled monolayer 2 is taken as being one which is endowed with a liquid repellent characteristic when making a liquid-repellent region upon the substrate 1, while it is taken as being one which is endowed with a lyophilic characteristic when making a liquid-affinity region upon the substrate 1.

After this, as shown in FIG. 6C, the resist 3 is stripped off from the surface of the substrate 1. By stripping off this resist 3, the self assembled monolayer 2 which has been formed as a layer upon the surface of the resist 3 is also stripped off from the substrate 1 in these regions. By doing this, it is possible to form a self assembled monolayer 2 which constitutes the liquid-repellent region or the liquid-affinity region in the desired pattern upon the surface of the substrate 1.

(Second Method for Manufacturing a Self Assembled Monolayer)

Figure 7A:
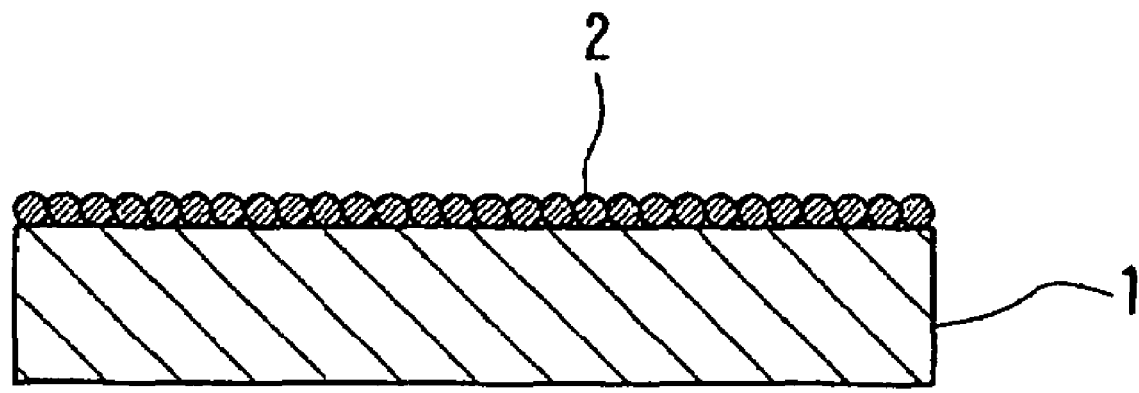
FIGS. 7A to 7B are general sectional views showing a second SAMs method for manufacturing the optical waveguide device according to this preferred embodiment of the present invention.
Figure 7B:
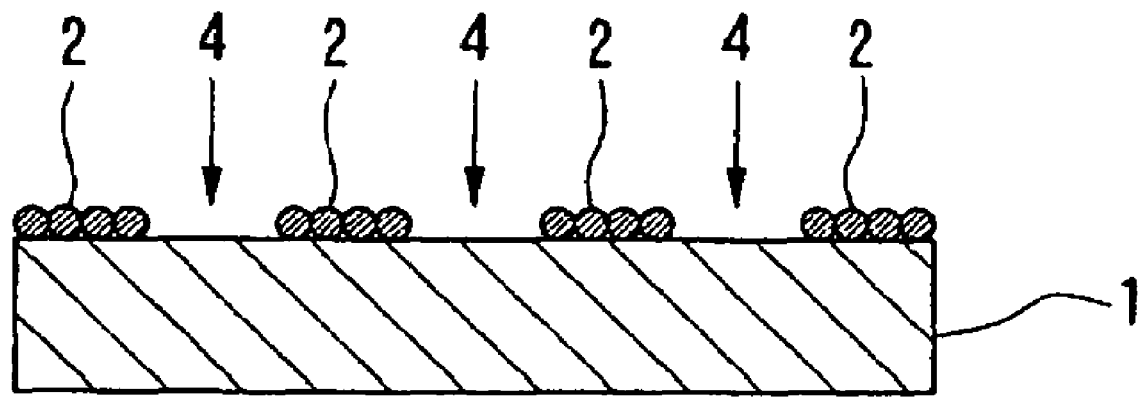

FIGS. 7A and 7B are general sectional views showing a second method for manufacturing a self assembled monolayer according to a preferred embodiment of the present invention. First, as shown in FIG. 7A, a self assembled monolayer 2 is formed over the entire surface of the substrate 1. It should be understood that it would also be acceptable to form the self assembled monolayer 2 over only a partial region of the surface of the substrate 1. Here, this self assembled monolayer 2 is supposed to be endowed with the quality of liquid repellence when making a liquid-repellent region, and to be endowed with the quality of lyophilicity when making a liquid-affinity region.

Subsequently, as shown in FIG. 7B, portions of the self assembled monolayer 2 which are not required are directly removed using an electron beam, an ion beam, or a ray of light 4. Here, by the portions which are not required, for example, when the self assembled monolayer 2 is endowed with a liquid repellent characteristic, is meant the portions in the region where the optical waveguide is to be formed, while, when the self assembled monolayer 2 is endowed with a lyophilic characteristic, is meant the portions in the regions other than the region where the optical waveguide is to be formed. By doing this, it is possible to form the self assembled monolayer 2 so that it has a liquid-repellent region or a liquid-affinity region in the desired pattern upon the surface of the substrate 1.

In this second method for manufacturing a self assembled monolayer, when eliminating the portions of the self assembled monolayer 2 which are not required by using a beam of light, it is desirable for the wavelength of this light to be below 250 nm. This is because such light of a wavelength of below 250 nm is capable of eliminating the self assembled monolayer, irrespective of the material from which the self assembled monolayer is made, since it has high energy.

With this second method for manufacturing a self assembled monolayer, instead of eliminating the self assembled monolayer 2 by the use of an electron beam, an ion beam, or a beam of light, it would also be acceptable to change the nature (the surface energy) of the self assembled monolayer 2 with an electron beam, an ion beam, or a beam of light. By doing this, it would be possible to control the liquid repellent characteristic, or the lyophilic characteristic, of the self assembled monolayer 2 easily and moreover at high accuracy.

Furthermore, it is also possible to make any desired pattern of liquid-repellent regions and liquid-affinity regions simply and at high accuracy by, for example, forming the self assembled monolayer 2 over the entire surface of the substrate as a layer, and thereafter irradiating the desired regions upon this self assembled monolayer 2 with an electron beam, an ion beam, or a beam of light.

(Third Method for Manufacturing a Self Assembled Monolayer)

Figure 8A:
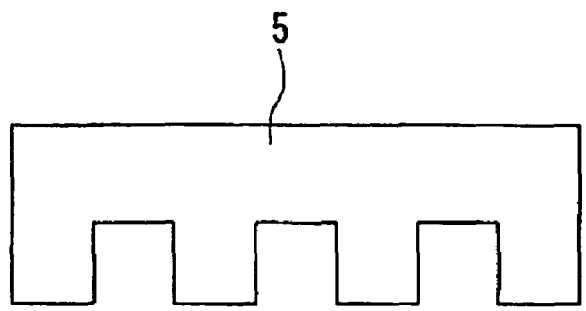
FIGS. 8A to 8D are general sectional views showing a third SAMs method for manufacturing the optical waveguide device according to this preferred embodiment of the present invention.

FIGS. 8A to 8D are general sectional view showing a third method of manufacture of a self assembled monolayer according to a preferred embodiment of the present invention. First, as shown in FIG. 8A, a stamp (mold) 5 of the desired form is manufactured. This stamp 5 may be made from silicone rubber, polydimethylsiloxane (PDMS), or the like. The shape of the convex portions of this stamp 5 is the same as the shape of the above described liquid-repellent region or liquid-affinity region.

Furthermore, the convex portions of the stamp 5 may be made by etching a base material. Or, alternatively, an original plate having a reversed pattern of convex portions may be manufactured by etching a base material, and the convex portions may be made by printing the shape of this original plate onto silicone rubber or resin or the like. Furthermore, for example, it would also be acceptable to use a stamp for micro contact printing (μCP) as the stamp 5. In such a case, it would also be acceptable to make the stamp 5 from polydimethylsiloxane (PDMS) or the like.

Figure 8B:
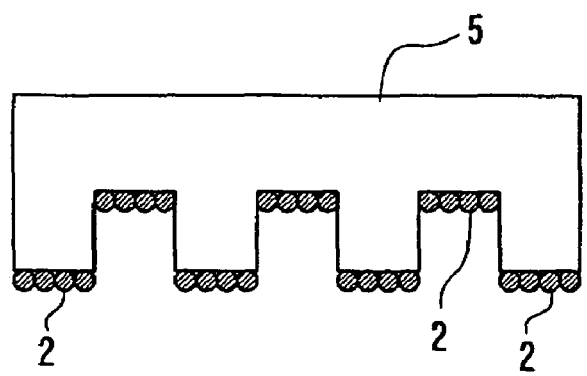

After this, as shown in FIG. 8B, a self assembled monolayer 2 is formed as a layer over the surface of the stamp 5. Here, this self assembled monolayer 2 is one which, when forming a liquid-repellent region, is endowed with a liquid repellent characteristic, while, when forming a liquid-affinity region, it is endowed with a lyophilic characteristic. For example, the stamp 5 which is made from polydimethylsiloxane (PDMS) or the like may be soaked for some time in a solution which is made up from a substance for making the self assembled monolayer dissolved in a solvent, and, after this, the self assembled monolayer 2 may be formed as a layer over the stamp 5 by drying the solution which adheres to the stamp 5.

Figure 8C:
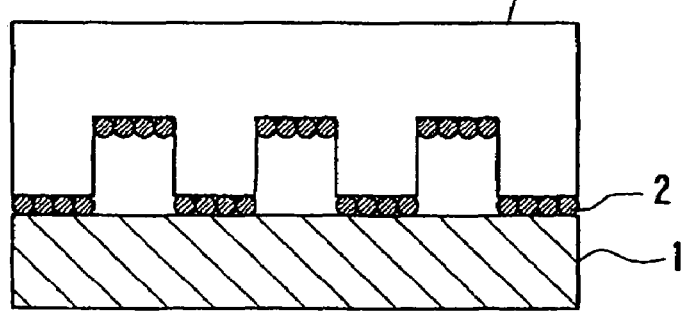

After this, as shown in FIG. 8C, the stamp 5 is pressed against the substrate 1 in a desired position, so that the self assembled monolayer 2 may be transferred to the surface of the substrate 1 by using micro contact printing (μCP). Micro contact printing is a type of relief printing.

Figure 8D:
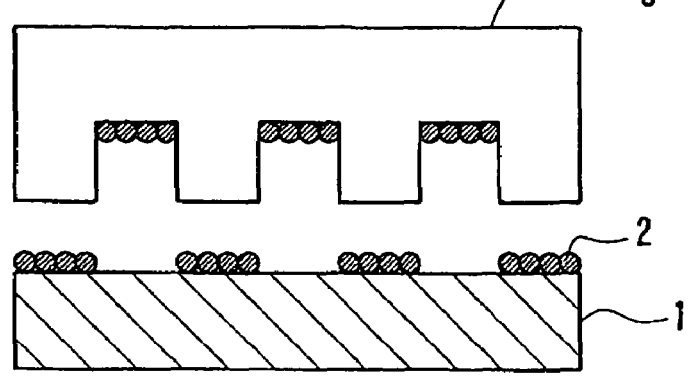

In addition, as shown in FIG. 8D, by taking away the stamp 5 from the surface of the substrate 1, the desired liquid-repellent region or liquid-affinity region which consists of the remaining self assembled monolayer 2 is formed in the desired position upon the surface of the substrate 1. After this, it is possible to take advantage of the stamp for a second or subsequent time; in other words, it is possible to repeat the processes described above and shown in FIGS. 8A to 8D a number of times using a single stamp 5.

With this method of manufacture of a self assembled monolayer, it is desirable for the respective material qualities of the stamp 5, the self assembled monolayer 2, and the substrate 1 to be selectively chosen so that the adherence between the surface of the stamp 5 and the self assembled monolayer 2 is weaker than the adherence between the portions of the substrate 1 upon which the liquid-repellent region or the liquid-affinity region is to be formed and the self assembled monolayer 2. By doing this, it becomes possible to execute the above described transfer process in a satisfactory manner.

Furthermore, with this method of manufacture of a self assembled monolayer, it is desirable to control the temperatures of the stamp 5, the self assembled monolayer 2, and the substrate 1 so that the adherence between the surface of the stamp 5 and the self assembled monolayer 2 is weaker than the adherence between the portions of the substrate 1 upon which the liquid-repellent region or the liquid-affinity region is to be formed and the self assembled monolayer 2. By doing this, it becomes possible to execute the above described transfer process in a satisfactory manner.

Furthermore, with this method of manufacture of a self assembled monolayer, as shown in FIG. 8C, it is desirable, after having pressed the stamp 5 against the surface of the substrate 1 and having thereby adhered the self assembled monolayer 2 to the substrate 1, to strip off the self assembled monolayer 2 from the stamp 5 by ablation.

In concrete terms, for example, the stamp 5 is made from a transparent material. In addition, laser ablation is generated between the stamp 5 and the self assembled monolayer 2 upon it by irradiation from the rear surface of the stamp 5 with the beam of a laser (for example, an excimer laser) in the ultraviolet region. By laser ablation is meant a technique in which the stamp 5 with the self assembled monolayer 2 upon it are irradiated with a beam of light in the ultraviolet region of the electromagnetic spectrum, and, at the boundary between the main body of the stamp 5 and the self assembled monolayer 2, gas or the like is generated by the energy which is absorbed from the light in the beam, so that this main body of the stamp 5 and the self assembled monolayer 2 are separated from one another.

By doing this, it is possible to strip off the self assembled monolayer 2 from the stamp 5 in a satisfactory manner.

(Another Method for Manufacturing an Optical Waveguide)

Figure 9A:
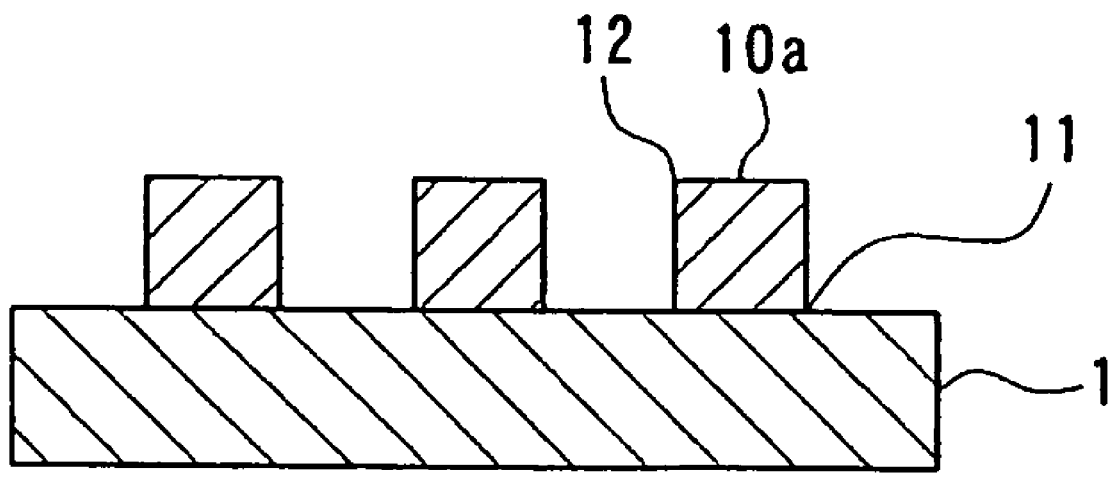
FIGS. 9A to 9B are general sectional views showing another method for manufacturing the optical waveguide device according to this preferred embodiment of the present invention.
Figure 9B:
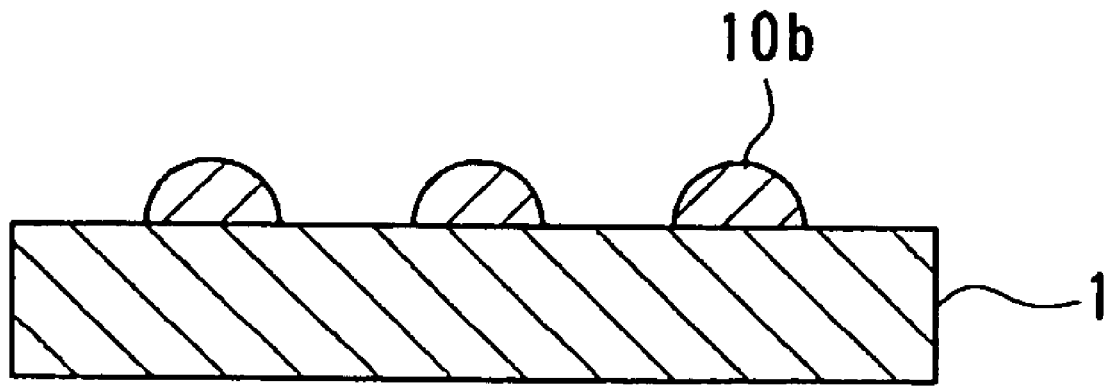

Next, another method for manufacturing the optical waveguide according to the preferred embodiment of the present invention will be described with reference to FIGS. 9A and 9B. FIGS. 9A and 9B are general sectional views showing this other method of manufacture of the optical waveguide according to the preferred embodiment of the present invention.

First, as shown in FIG. 9A, an optical waveguide 10*a* is formed upon the substrate 1 by utilizing any one of the above described methods, or the like. This optical waveguide 10*a* is, in this case, one which has angular portions 11 and 12, or portions which are curved portions whose cross section or the like is not a smooth curvilinear shape. This type of angular portion 11 and 12 constitutes a location upon the optical waveguide 10*a* in which light transmission loss may occur.

Thus, the substrate 1 upon which the optical waveguide 10*a* as shown in FIG. 9A is made is subjected to a heat reflow process. In addition, the shape of the optical waveguide 10*a* is controlled by this heat reflow process. When this is done, as shown in FIG. 9B, the angular portions 11 and 12 of the optical waveguide 10*a* become distorted into smooth curvilinear shapes, and their cross sections become similar to that of a convex lens or a semicircular shape, and accordingly the resulting optical waveguide 10*b* is easily formed. Thereby, according to this preferred embodiment of the present invention, it is possible easily to manufacture an optical waveguide which has high light transmission efficiency.

Furthermore, the optical waveguide 10 according to this preferred embodiment of the present invention may be manufactured by a mist deposition method. In other words, a solution which includes the material from which the optical waveguide 10 is to be made (polyimide or the like) is made into a mist by ultrasonic waves or the like, and is supplied to the substrate 1 upon which the liquid-repellent region or the liquid-affinity region has been produced. Here, the solution which is made into a mist is repelled from the liquid-repellent region upon the substrate 1, and/or is attracted to the liquid-affinity region thereon.

Thus, by forming the optical waveguide by using such a mist deposition method, it is possible to control the shape of the optical waveguide 10, such as its line width and so on, easily and moreover at high accuracy.

(Method for Manufacturing a Micro Tile Shaped Element)

Next, a method for manufacturing the micro tile shaped elements 21 and 22 will be explained with reference to FIGS. 10 to 19. This method of manufacture is based upon an epitaxial liftoff method. In the discussion of this method of manufacture, the case of attaching a compound semiconductor device (a compound semiconductor element) as the micro tile shaped element, upon a silicon/LSI chip which constitutes the substrate 1 will be explained; but the application of the present invention is not limited to this type of semiconductor device and this type of LSI chip. It should be understood that although, in this description of the present embodiment of the present invention, by the use of the term "semiconductor substrate" it is implied that the device is made from a semiconducting raw material, this substrate is not to be considered as being limited to being shaped as a plate; any semiconductor raw material may be used, shaped in whatever form may be convenient, and the term "semiconductor substrate" is intended to cover all such possiblities.

(First Process)

FIG. 10 is a schematic sectional view showing a first process in the method of manufacture of a micro tile shaped element according to the present invention. Referring to FIG. 10, a substrate 110 is a semiconductor substrate, and may be, for example, a gallium—arsenide semiconductor substrate. As the lowest layer of the substrate 110, there is provided a sacrificial layer 111. The sacrificial layer 111 is made from aluminum arsenide (AlAs), and its thickness may be, for example, several hundreds of nanometers.

For example, a functional layer 112 is provided above the sacrificial layer 111. The thickness of this functional layer 112 may be, for example, from 1 μm to about 10 (20) μm. In addition, semiconductor devices (semiconductor element) 113 are constructed in this functional layer 112. As such semiconductor devices 113 there may be suggested, for example, a light emitting diode (LED), a vertical cavity surface emitting laser (VCSEL), a photodiode (PD), a DFB laser, or the like. Each of these semiconductor devices 113 is one in which elements are made by superimposing multiple numbers of epitaxial layers over a substrate 110. Furthermore, in each of the semiconductor devices, electrodes are also manufactured, and operational tests are also performed.

(Second Process)

FIG. 11 is a schematic sectional view showing a second process in the method of manufacture of a micro tile shaped element according to the present invention. Referring to FIG. 11, in this process, separation grooves 121 are formed so as to separate the various semiconductor devices. These separation grooves 121 are grooves which have a depth which reaches at least to the sacrificial layer 111. For example, the width and the depth of these separation grooves may both be from 10 μm to several hundreds of μm. Furthermore, these separation grooves 121 are grooves which are linked without any interruption, so that a selective etching liquid which will be described hereinafter may flow along said separation grooves 121. Moreover, it is desirable for the separation grooves 121 to be formed in the shape of a lattice, like a go board.

Furthermore, the gap between adjoining ones of the separation grooves 121 may be from several tens of μm to several hundreds of μm, and each of the semiconductor. devices 113 which are separated by the separation grooves 121 may be generally of a square surface shape, with a size of from several tens of μm to several hundreds of μm. As the method for manufacturing the separation grooves 121, a method of photolithography and wet etching may be used, or a method of dry etching. Furthermore, it would be acceptable to form the separation grooves 121 by dicing into letter U shaped grooves, provided that no cracks occurred in the substrate.

(Third Process)

FIG. 12 is a schematic sectional view showing a third process in the method of manufacture of a micro tile shaped element according to the present invention. Referring to FIG. 12, in this process, an intermediate transfer film 131 is adhered to the surface of the substrate 110 (on the side of the semiconductor devices 113). This intermediate transfer film 131 is a film shaped as a flexible belt, upon the surface of which is painted a tackiness agent.

(Fourth Process)

Figure 13:
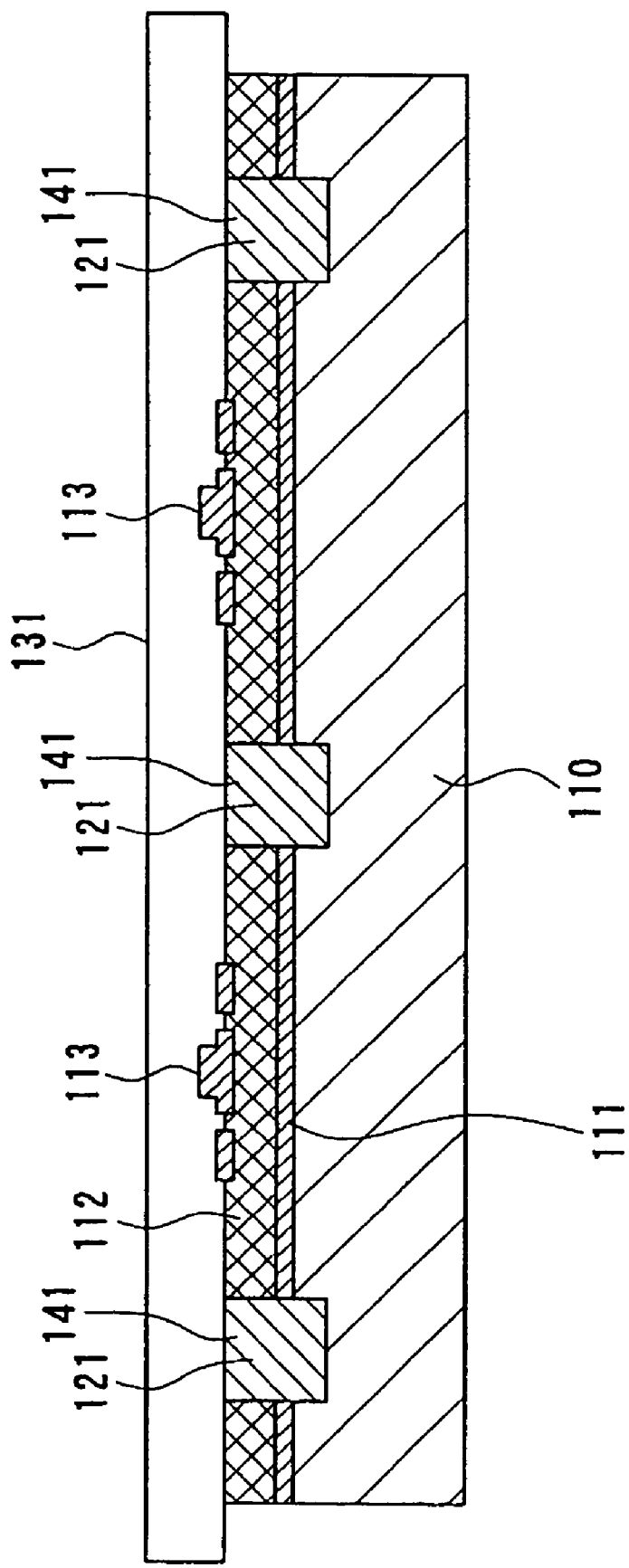
FIG. 13 is a schematic sectional view showing a fourth process in this method of manufacture.

FIG. 13 is a schematic sectional view showing a fourth process in the method of manufacture of a micro tile shaped element according to the present invention. Referring to FIG. 13, in this process, a selective etching liquid 141 is infiltrated into the separation grooves 121. Since only the sacrificial layer 111 is to be selectively etched in this process, hydrochloric acid in low concentration is used as the selective etching liquid 141, because its selectivity for aluminum arsenide is high.

(Fifth Process)

Figure 14:
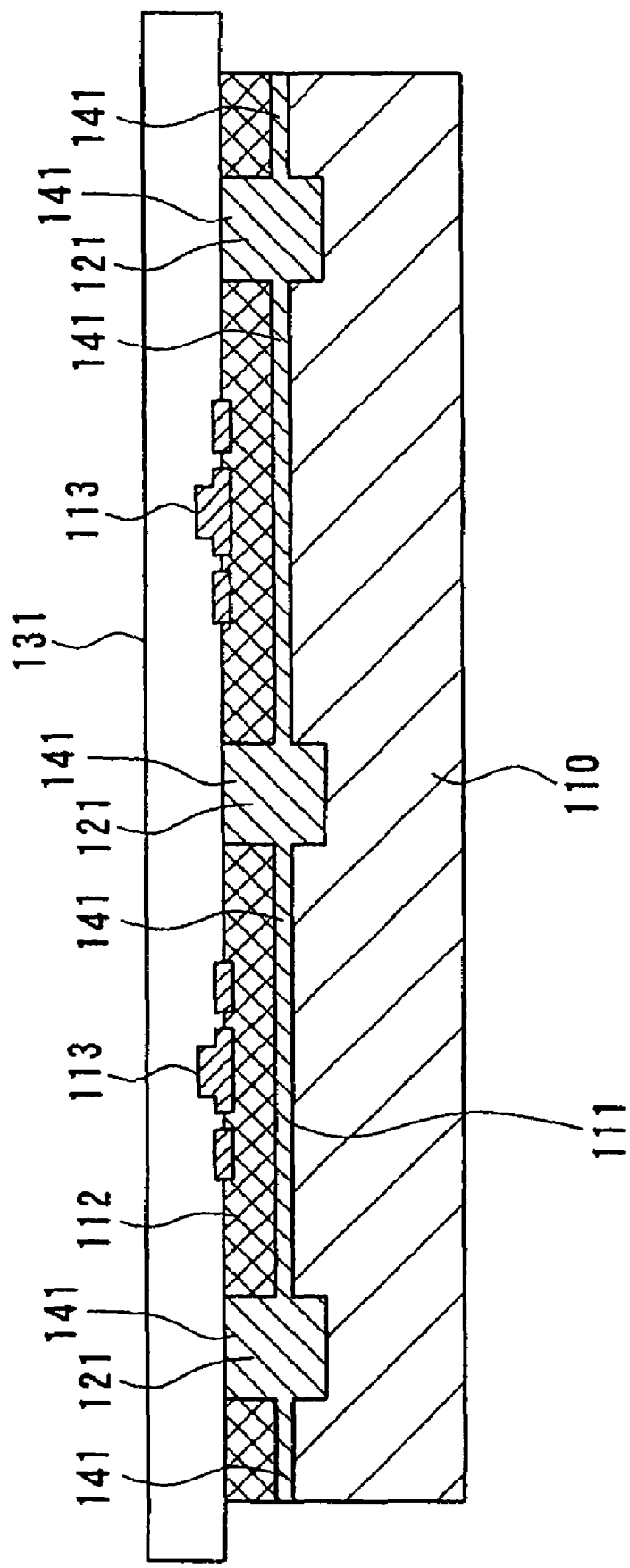
FIG. 14 is a schematic sectional view showing a fifth process in this method of manufacture.

FIG. 14 is a schematic sectional view showing a fifth process in the method of manufacture of a micro tile shaped element according to the present invention. Referring to FIG. 14, in this process, by allowing a predetermined time period to elapse from after the insinuation of the selective etching liquid 141 into the separation grooves 121 in the fourth process described above, it is ensured that all of the sacrificial layer 11 has selectively been etched away from the substrate 110 and has been eliminated.

(Sixth Process)

Figure 15:
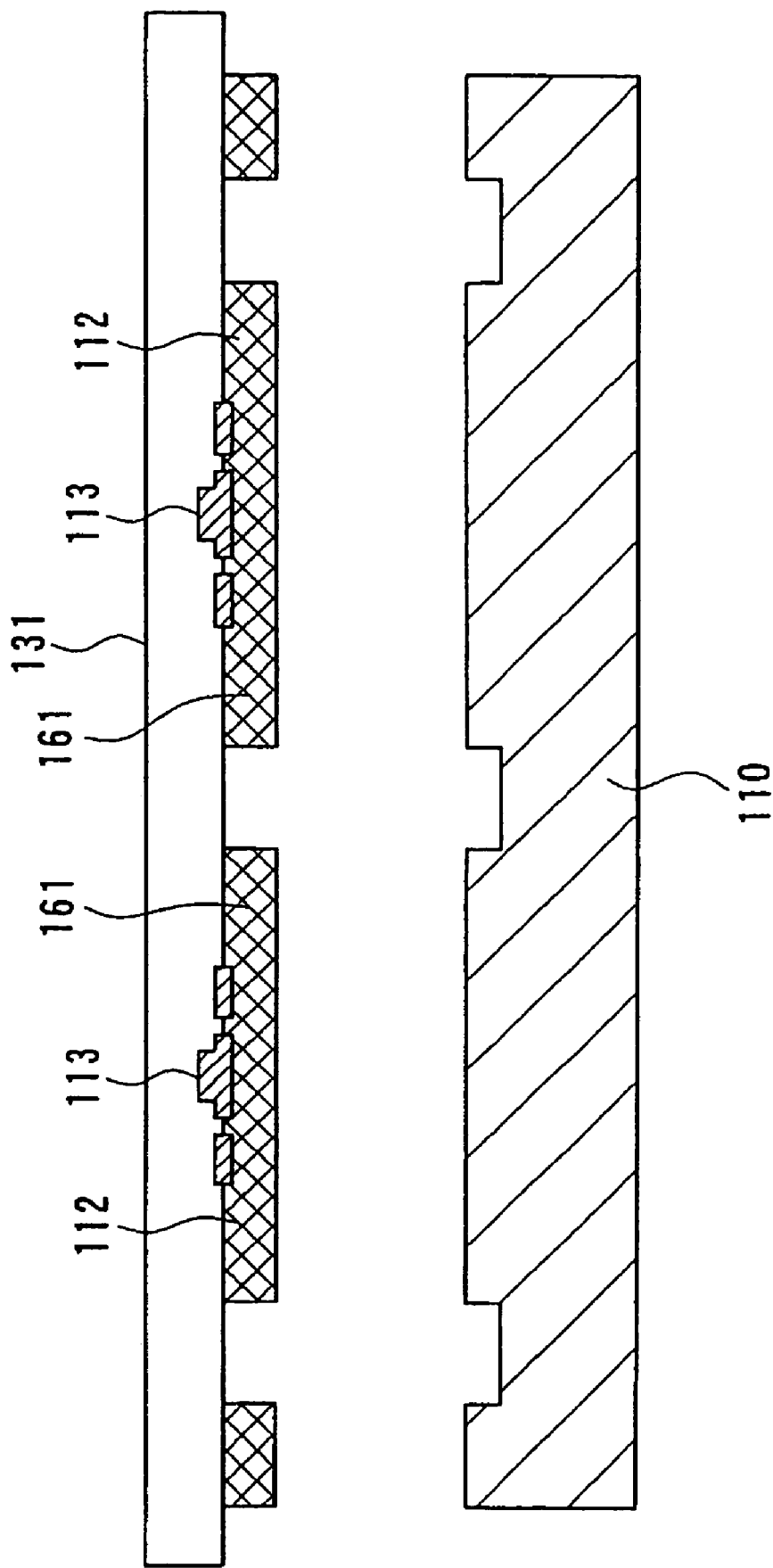
FIG. 15 is a schematic sectional view showing a sixth process in this method of manufacture.

FIG. 15 is a schematic sectional view showing a sixth process in the method of manufacture of a micro tile shaped element according to the present invention. When the sacrificial layer 111 is completely etched in the fifth process described above, the functional layer 112 is cut away from the substrate 110. In addition, in this sixth process, by pulling away the intermediate transfer film 131 from the substrate 110, the functional layer 112 adheres to this intermediate transfer film 131 and is pulled away from the substrate 110 together therewith.

By performing these operations, the functional layer 112 which is constituted by the semiconductor devices 13 is separated by the formation of the separation grooves 121 and the etching of the sacrificial layer 111, and semiconductor elements (in the above described preferred embodiment, the "micro tile shaped elements") of a predetermined form (for example, of a micro tile form) are produced, and are kept adhered to the intermediate transfer film 131. Here it is desirable for the thickness of the functional layer to be, for example, from 1 μm to 8 μm, and for its size (length and width) to be, for example, from several tens of μm to several hundreds of μm.

(Seventh Process)

Figure 16:
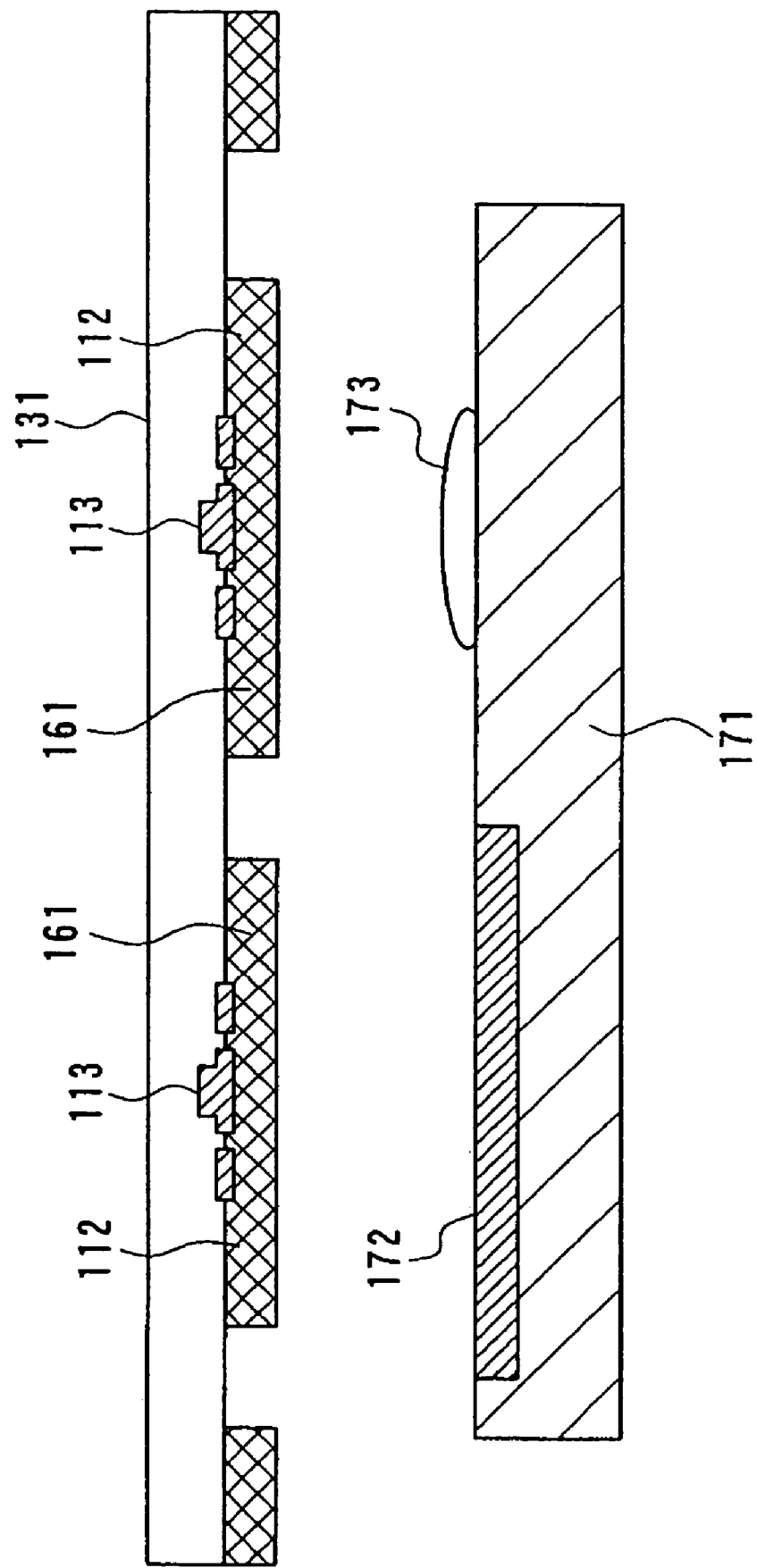
FIG. 16 is a schematic sectional view showing a seventh process in this method of manufacture.

FIG. 16 is a schematic sectional view showing a seventh process in the method of manufacture of a micro tile shaped element according to the present invention. Referring to FIG. 16, in this process, by shifting the intermediate transfer film 131 (with the micro tile shaped elements 161 adhered to it), the micro tile shaped elements 161 are arranged in the desired positions upon the final substrate 171. Here, the final substrate 171 may be made, for example, from a silicon semiconductor material (which corresponds to the substrate 1 of FIG. 1), and an LSI region 172 may be formed upon it. Furthermore, an adhesive material 173 may be spread upon the final substrate 171 in the desired position for adhering a micro tile shaped element 161 thereon.

(Eighth Process)

Figure 17:
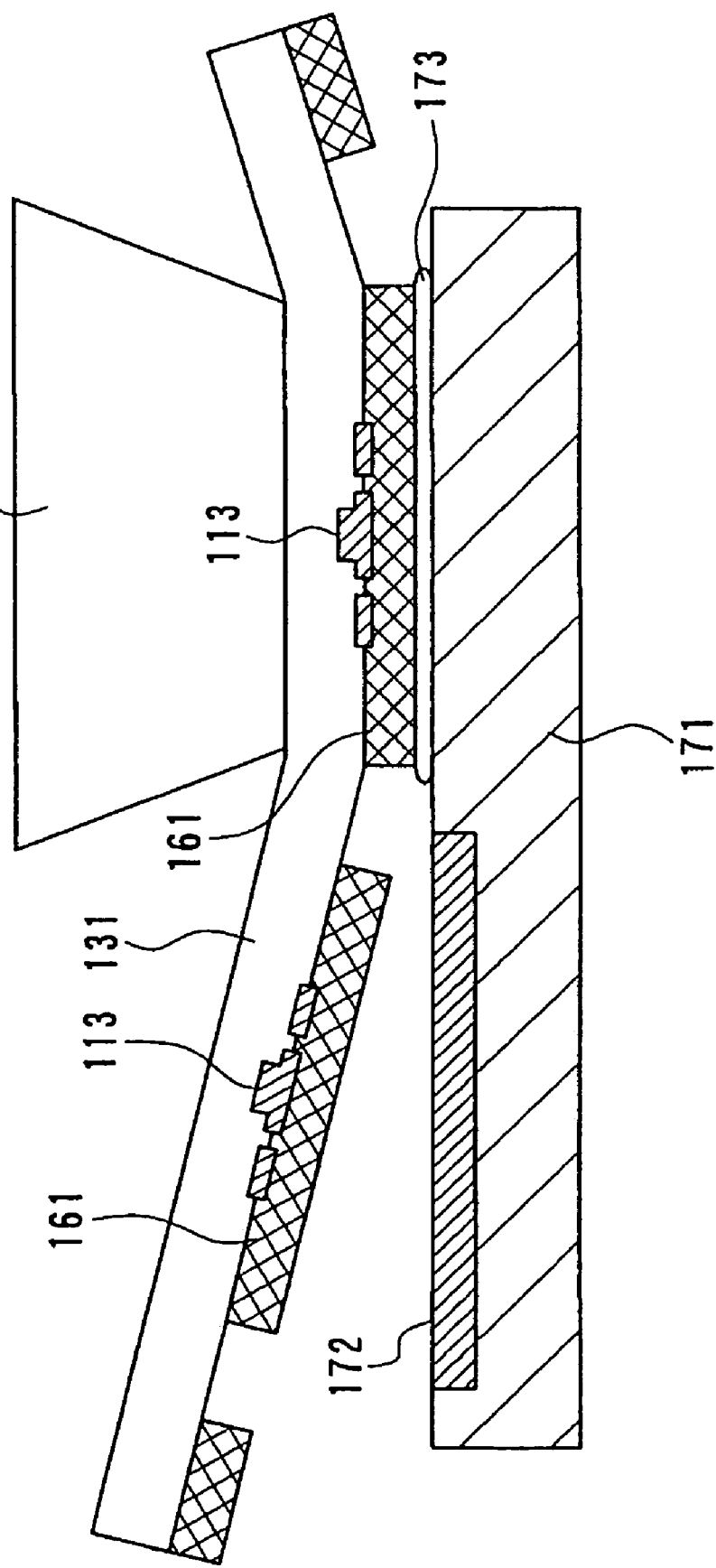
FIG. 17 is a schematic sectional view showing an eighth process in this method of manufacture.

FIG. 17 is a schematic sectional view showing an eighth process in the method of manufacture of a micro tile shaped element according to the present invention. Referring to FIG. 17, in this process, a micro tile shaped element 161 which has been arranged in the desired position upon the final substrate 171 is attached to the final substrate 171 by being pressed against it by a tool 181 which presses against the back of, and through, the intermediate transfer film 131. Here, the micro tile shaped element 161 is adhered in the desired position upon the final substrate 171, since the adhesive substance 173 is spread over this final substrate 171 in the desired position.

(Ninth Process)

Figure 18:
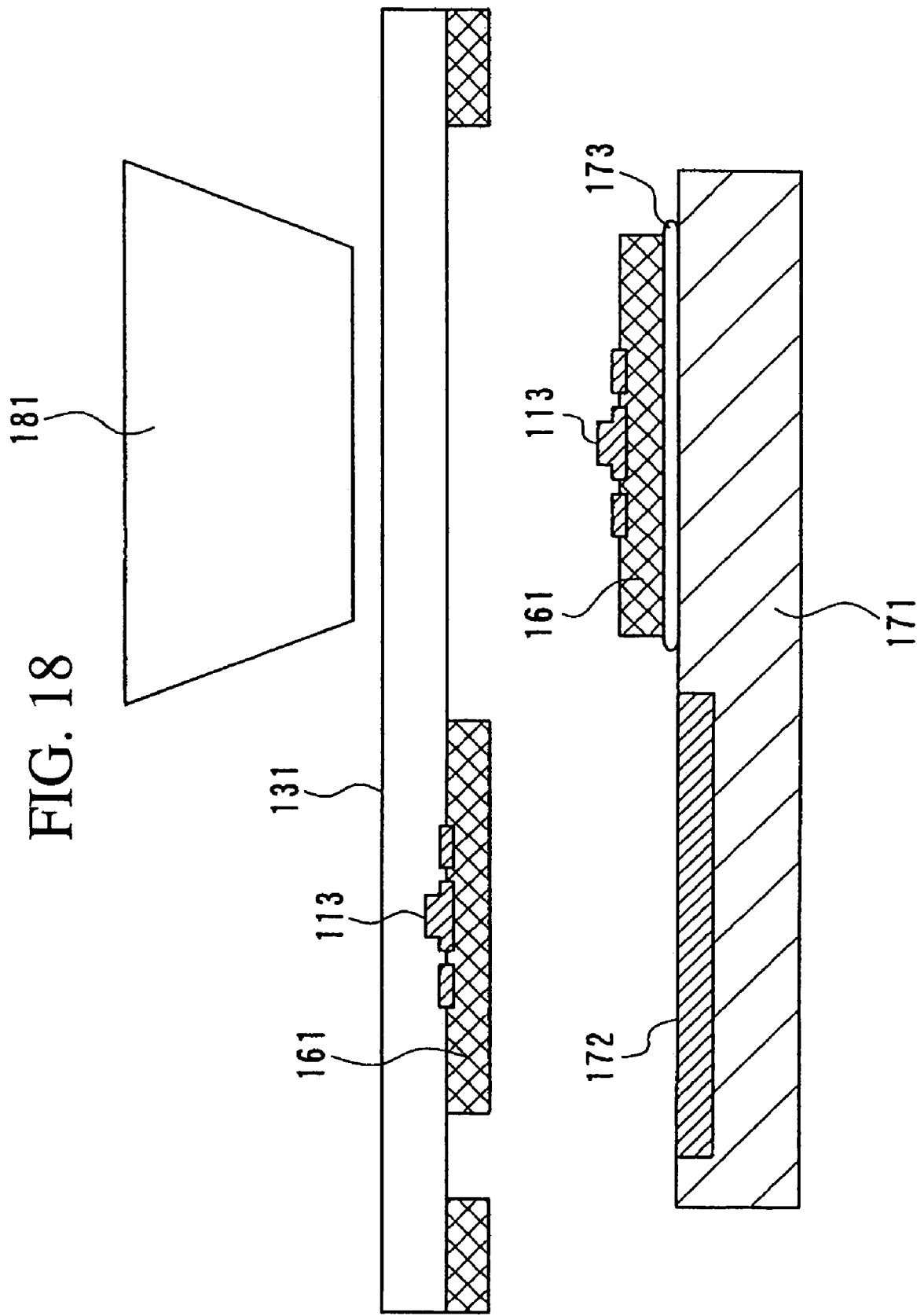
FIG. 18 is a schematic sectional view showing a ninth process in this method of manufacture.

FIG. 18 is a schematic sectional view showing a ninth process in the method of manufacture of a micro tile shaped element according to the present invention. Referring to FIG. 18, in this process, by nullifying the adhesive force of the intermediate transfer film 131, the intermediate transfer film 131 is torn away from the micro tile shaped element 161.

The adhesive material of the intermediate transfer film 131 is an adhesive whose sticking force is nullified by ultraviolet light (UV) or by heat. In the case of an adhesive material which is endowed with the characteristic of being hardened by UV light, the rear pressing tool 181 is made from a material which is endowed with the quality of being transparent, so that it is possible to nullify the adhesive force of the intermediate transfer film 131 by irradiating ultraviolet light (UV) from the edge of the pressing tool 181. On the other hand, in the case of an adhesive material which is endowed with the characteristic of being hardened by heat, the pressing tool 181 may be heated up. Or alternatively, at the conclusion of the sixth process, it would also be acceptable to irradiate the entire surface of the intermediate transfer film 131 with ultraviolet light or the like, so as to nullify the adhesive force over its entire surface. Although it has been stated above that the adhesive force is nullified, in actual fact a small amount of adhesive force remains, so that the micro tile shaped elements 161 remain held by the intermediate transfer film 131, since they are extremely thin and light.

(Tenth Process)

No figure is shown for this process. In this process, a heating process or the like is performed, and thereby the micro tile shaped element 161 is finally firmly attached to the final substrate 171.

(Eleventh Process)

Figure 19:
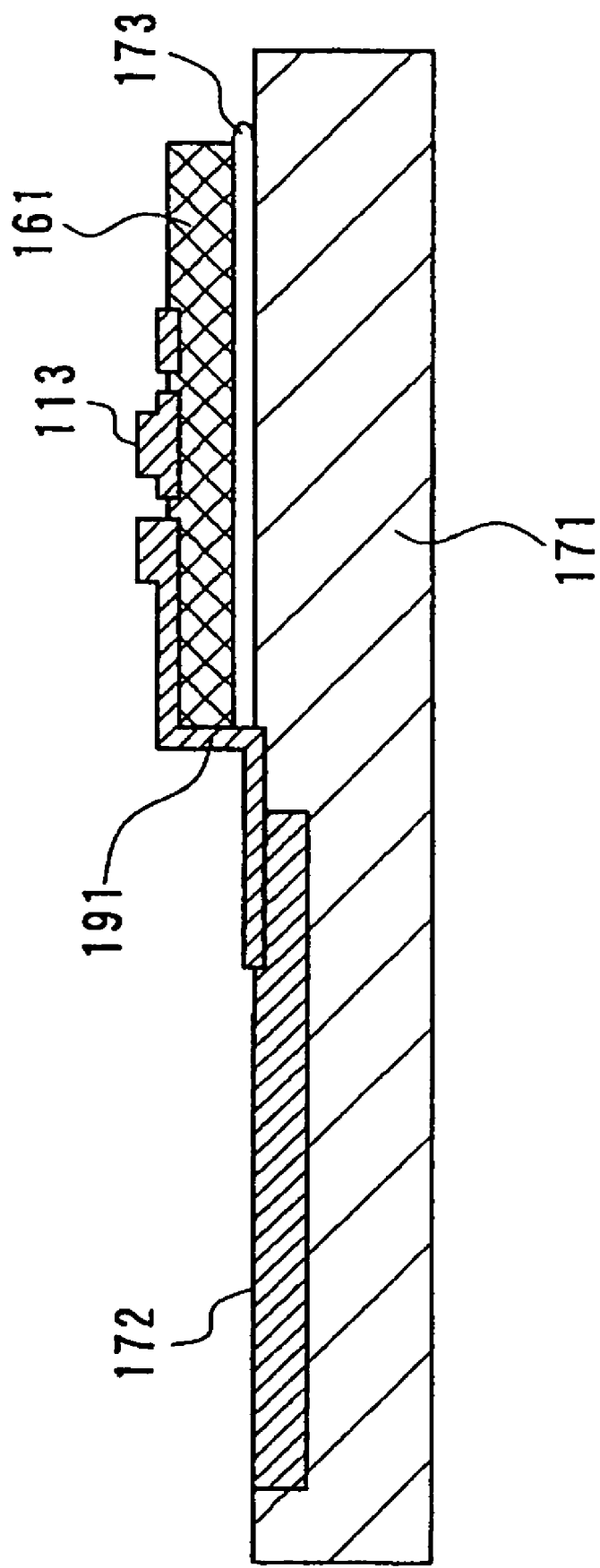
FIG. 19 is a schematic sectional view showing an eleventh process in this method of manufacture.

FIG. 19 is a schematic sectional view showing an eleventh process in the method of manufacture of a micro tile shaped element according to the present invention. Referring to FIG. 19, in this process, the electrodes of the micro tile shaped elements 161 and the circuitry upon the final substrate 171 are connected together by lead wires 191, so as to complete the manufacture of a single LSI chip or the like (an integrated circuit chip which utilizes the method of manufacture of an optical waveguide according to the present invention). As the final substrate 171, not only may a silicon semiconductor be utilized, but also it will be acceptable to utilize a quartz substrate or a plastic film.

(Examples of Application)

In the following, various examples of application of the method for manufacturing an optical waveguide, and of the optical waveguide device, according to the present invention will be explained.

As a first example of application, an optical waveguide which has been manufactured according to the method for manufacturing an optical waveguide, or an optical waveguide device, according to a preferred embodiment of the present invention described above, is utilized as a signal transmission device in an opto-electronic integrated circuit. As an opto-electronic integrated circuit, for example, a computer may be considered. And, although the signal processing in the integrate circuit which constitutes the CPU is performed by using electrical signals, the optical waveguide which has been manufactured according to the method for manufacturing an optical waveguide, or the optical waveguide device, according to a preferred embodiment of the present invention described above is applied to the bus which transmits data between the CPU and a storage means or the like.

By doing this, according to this example of application of the present invention, it is possible greatly to enhance the signal transmission speed over the bus, which has been a bottleneck to the processing speed of a computer, over the prior art, and also the external shape of this computer is not enlarged; and, moreover, it is possible to manufacture this computer in a simple manner.

As a second example of application, an optical waveguide which has been manufactured according to the method for manufacturing an optical waveguide, or an optical waveguide device, according to a preferred embodiment of the present invention described above, may be utilized in a flat display device such as a liquid crystal display a plasma display, or an organic EL (electro-luminescent) display or the like, which are electro-optical devices. For example, the above described optical waveguide may be utilized for the scan lines of a flat display device. When this is done, it is possible to spur on increase in the size of the screen and high product quality of a flat display device, since it is possible to transmit the scanning signal at high speed.

(Electronic Apparatus)

Examples of electronic apparatuses which incorporate optical waveguides which have been manufactured according to the method for manufacturing an optical waveguide, or optical waveguide devices, according to a preferred embodiment of the present invention described above, will now be explained.

Figure 20:
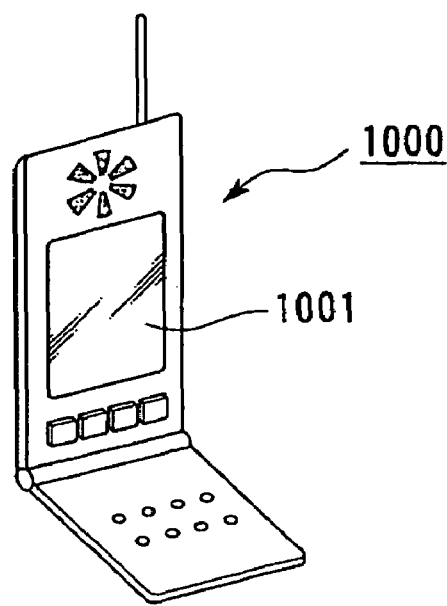
FIG. 20 is a diagram showing an example of an electronic device which is equipped with a circuit according to this preferred embodiment of the present invention.

FIG. 20 is a perspective view showing an example of a portable telephone. In this figure, the reference symbol 1000 denotes a portable telephone main body which utilizes an optical waveguide which has been manufactured according to the method for manufacturing an optical waveguide described above, while the reference symbol 1001 denotes a display section which utilizes the above described electro-optical apparatus.

Figure 21:
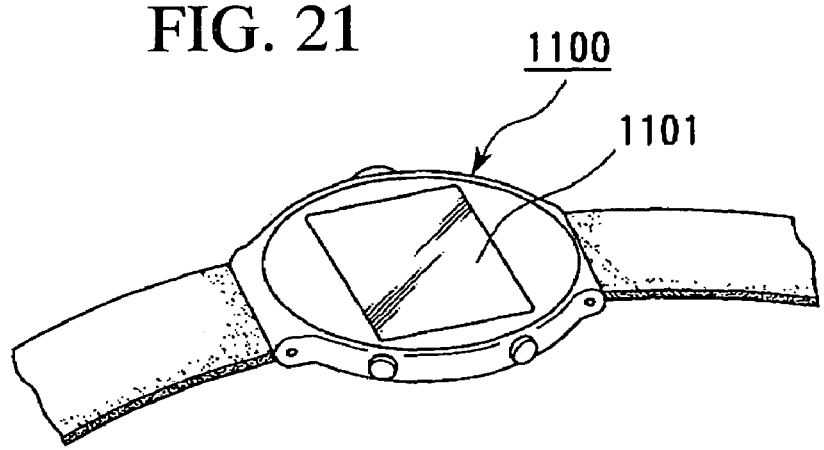
FIG. 21 is a diagram showing another example of an electronic device which is equipped with a circuit according to this preferred embodiment of the present invention.

FIG. 21 is a perspective view showing an example of a wristwatch type electronic device. In this figure, the reference symbol 1100 denotes a watch main body which utilizes an optical waveguide which has been manufactured according to the method for manufacturing an optical waveguide described above, while the reference symbol 1101 denotes a display section which utilizes the above described electro-optical apparatus.

Figure 22:
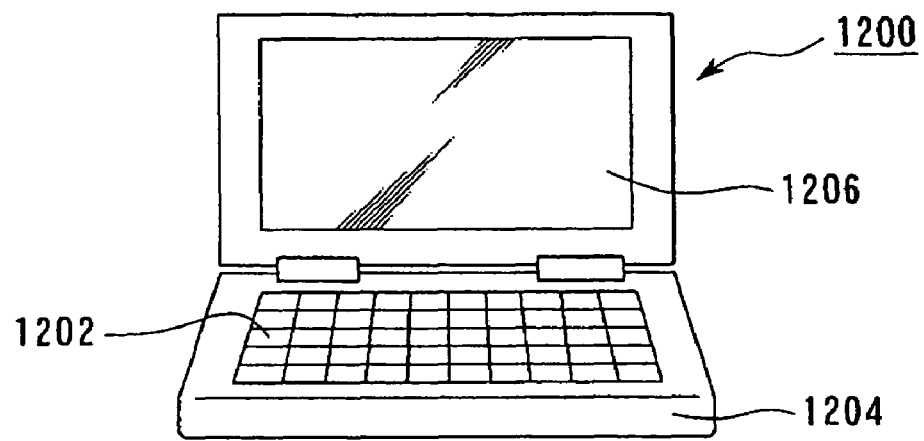
FIG. 22 is a diagram showing yet another example of an electronic device which is equipped with a circuit according to this preferred embodiment of the present invention.

In addition, FIG. 22 is a perspective view showing an example of a portable type information processing device such as a word processor, a personal computer, or the like. In this figure, the reference symbol 1200 denotes the information processing device, the reference symbol 1202 denotes an input section thereof such as a keyboard or the like, the reference symbol 1204 denotes a main body of the information processing device which utilizes an optical waveguide which has been manufactured according to the method for manufacturing an optical waveguide described above, while the reference symbol 1206 denotes a display section which utilizes the above described electro-optical apparatus.

Since the electronic devices shown in FIGS. 20 to 22 include optical waveguides or electro-optical apparatuses which have been made according to the method for manufacturing an optical waveguide of the above described preferred embodiment of the present invention, they have Excellent quality as far as their display means are concerned, and, in particular, in this manner, it is possible to implement electronic devices which are provided with display sections which include bright, large screens and which are endowed with high speed response characteristics.

Furthermore, by utilizing the above described method for manufacturing an optical waveguide of the above described preferred embodiment according to the present invention, it is possible to make these electronic apparatuses more compact than had been possible in the prior art. Even further, by utilizing the above described method for manufacturing an optical waveguide of the above described preferred embodiment according to the present invention, it is also possible to reduce the manufacturing cost of these electronic apparatuses below that in the prior art.

It should be noted that the technical range of the present invention is not to be considered as being limited to the above described preferred embodiment thereof; it would be possible to vary the details of any particular preferred embodiment of the present invention, as appropriate, provided that its gist were not to be departed from, since the shown details of the above described preferred embodiment of the present invention are only one of many possible examples and variants thereof.

For example, with the method of manufacture of a self assembled monolayer of the above described preferred embodiment of the present invention which utilizes a stamp 5, the self assembled monolayer which is made with the stamp 5 is not to be considered as being limited to being a single layered one; it would also be acceptable to make a multi layered self assembled monolayer upon a convex portion of the stamp 5.

When this is done, it is possible to transfer in series these self assembled monolayers which have been made upon the stamp 5 onto the substrate 1 one layer at a time, and it is thereby possible to transfer a plurality of self assembled monolayers to the substrate 1 at a higher speed than heretofore.

Furthermore, it would also be acceptable to make the stamp 5 itself with a self assembled monolayer. When this is done, it is possible to make a more densely detailed stamp 5, so that it is possible to make a more finely detailed optical waveguide.

Yet further although, in the above described preferred embodiment of the present invention, both a liquid-repellent region and a liquid-affinity region were manufactured using self assembled monolayers, it would also be acceptable to manufacture a division wall (a bank) of convex form which surrounded the optical waveguide by using a self assembled monolayer. By doing this, it would be possible to load the material for formation of the optical waveguide more accurately into the optical waveguide formation region, so that it would be possible to manufacture the optical waveguide more accurately.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method for manufacturing an optical waveguide, comprising the steps of:
    forming at least one of a liquid-repellent region and a liquid-affinity region upon a substrate; and
    forming the optical waveguide in a region upon the substrate other than the liquid-repellent region, or forming the optical waveguide in the liquid-affinity region upon the substrate:
    wherein at least one of the liquid-repellent region and the liquid-affinity region is made by:
    forming a mask layer in a desired pattern upon the substrate by utilizing a droplet discharge method; then
    forming a self assembled monolayer upon the substrate; and then
    removing the mask layer.

2. A method for manufacturing an optical waveguide according to claim 1,
    wherein the optical waveguide is made by hardening an optical waveguide material in the form of liquid, and
    the liquid-repellent region is a region to which liquid-repellency with respect to the optical waveguide material is imparted.

3. A method for manufacturing an optical waveguide according to claim 1,
    wherein the optical waveguide is made by hardening an optical waveguide material in the form of liquid, and
    the liquid-affinity region is a region which is lyophilic with respect to the optical waveguide material.

4. A method for manufacturing an optical waveguide according to claim 1, wherein the mask layer is made from a resist material.

5. A method for manufacturing an optical waveguide according to claim 1, further comprising the steps of:
    converting a predetermined material into the form of a mist; and
    layering the predetermined material upon the substrate.

* * * * *